(12) United States Patent
Kim et al.

(10) Patent No.: US 12,531,323 B2
(45) Date of Patent: Jan. 20, 2026

(54) ANTENNA RF MODULE, RF MODULE ASSEMBLY, AND ANTENNA DEVICE INCLUDING SAME

(71) Applicant: KMW INC., Hwaseong-si (KR)

(72) Inventors: Duk Yong Kim, Yongin-si (KR); Joon Hyong Shim, Yongin-si (KR); Sung Hwan So, Hwaseong-si (KR); Bae Mook Jeong, Suwon-si (KR); Min Seon Yun, Anyang-si (KR); Kyo Sung Ji, Hwaseong-si (KR); Chi Back Ryu, Hwaseong-si (KR); Sung Ho Jang, Yongin-si (KR); Jae Hong Kim, Yongin-si (KR); Oh Seog Choi, Hwaseong-si (KR); Yong Won Seo, Daejeon (KR)

(73) Assignee: KMW INC., Hwaseong-si (KR)

( * ) Notice: Subject to any disclaimer, the term of this patent is extended or adjusted under 35 U.S.C. 154(b) by 216 days.

(21) Appl. No.: 18/136,873

(22) Filed: Apr. 19, 2023

(65) Prior Publication Data

US 2023/0299456 A1    Sep. 21, 2023

Related U.S. Application Data

(63) Continuation of application No. PCT/KR2021/014674, filed on Oct. 20, 2021.

(30) Foreign Application Priority Data

Oct. 20, 2020   (KR) .................. 10-2020-0135788
Oct. 18, 2021   (KR) .................. 10-2021-0138030

(51) Int. Cl.
*H01Q 1/02*     (2006.01)
*H01Q 1/48*     (2006.01)
(Continued)

(52) U.S. Cl.
CPC ................ *H01Q 1/02* (2013.01); *H01Q 1/48* (2013.01); *H01Q 15/14* (2013.01); *H01Q 21/24* (2013.01)

(58) Field of Classification Search
CPC .......... H01Q 1/02; H01Q 1/48; H01Q 15/14; H01Q 21/24; H01Q 21/0025; H01Q 21/065
See application file for complete search history.

(56) References Cited

U.S. PATENT DOCUMENTS 5,293,171 A    3/1994   Cherrette
6,060,966 A *  5/2000   Tennant .................. F28F 13/02
                                                 165/80.4

(Continued)

FOREIGN PATENT DOCUMENTS

CN    209183752 U    7/2019
EP    3544204 A2     9/2019
(Continued)

OTHER PUBLICATIONS

Non-final office action dated Jun. 18, 2024 for the Japanese Application No. 2023-522983.
(Continued)

*Primary Examiner* — Hai V Tran
(74) *Attorney, Agent, or Firm* — Insight Law Group, PLLC; Seung Lee

(57) ABSTRACT

An RF filter has at least four outer side surfaces, a radiation element module which is disposed on one surface of the outer side surfaces of the RF filter, an amplifier substrate which is disposed on another surface of the outer side surfaces of the RF filter and on which an analogue amplification element is mounted, and a reflector which is disposed between the RF filter and the radiation element module to ground (GND) the radiation element module and also mediate the outwardly dissipating heat generated by the
(Continued)

RF filter. Socket pins are coupled to a main board disposed at an antenna housing in a unit of a module.

19 Claims, 27 Drawing Sheets

(51) Int. Cl.
*H01Q 15/14* (2006.01)
*H01Q 21/24* (2006.01)

(56) References Cited

U.S. PATENT DOCUMENTS

| | | | | |
|---|---|---|---|---|
| 2014/0218883 | A1* | 8/2014 | Dakhiya | H05K 3/32 |
| | | | | 29/830 |
| 2015/0250022 | A1* | 9/2015 | Kim | H05K 7/20545 |
| | | | | 455/561 |
| 2019/0348734 | A1* | 11/2019 | Kim | H01Q 1/241 |
| 2021/0305684 | A1* | 9/2021 | Hou | H01Q 15/23 |
| 2021/0305717 | A1* | 9/2021 | Hou | H04B 7/0413 |
| 2022/0102842 | A1* | 3/2022 | Li | H01Q 1/42 |

FOREIGN PATENT DOCUMENTS

| | | |
|---|---|---|
| EP | 4231443 A1 | 8/2023 |
| JP | 2003-298332 A | 10/2003 |
| JP | 2004-120325 A | 4/2004 |
| JP | 2009-159430 A | 7/2009 |
| JP | 2013-031142 A | 2/2013 |
| JP | 2019-536362 A | 12/2019 |
| KR | 10-2015-0095673 A | 8/2015 |
| WO | 2016-047005 A1 | 3/2016 |

OTHER PUBLICATIONS

Extended European Search Report dated Nov. 11, 2024 for European Application No. 21883225.1.
International Search Report mailed Jan. 25, 2022 for International Application No. PCT/KR2021/014674 and its English translation.

* cited by examiner (a)　　　　　(b)

(a)

(b)

(a)    (b)

(a)

(b)

(c)

(a)            (b)

ANTENNA RF MODULE, RF MODULE ASSEMBLY, AND ANTENNA DEVICE INCLUDING SAME

CROSS-REFERENCE TO RELATED APPLICATIONS

This application is a continuation application of International Application No. PCT/KR2021/014674, filed Oct. 20, 2021, which claims the benefit of Korean Patent Application Nos. 10-2020-0135788, filed Oct. 20, 2020; and 10-2021-0138030, filed Oct. 18, 2021, in the Korean Intellectual Property Office, the disclosures of which are incorporated herein in their entirety by reference.

TECHNICAL FIELD

The present invention relates to an antenna RF module, an RF module assembly, and an antenna device including the same, and more particularly, to an antenna RF module which can improve heat dissipation performance, be manufactured slimly, and reduce manufacturing costs by removing a radome of a conventional antenna device and disposing a radiation element module and an RF element so that the radiation element module and the RF element are exposed to the outside air in front of an antenna housing, an RF module assembly, and an antenna device including the same.

BACKGROUND ART

A base station antenna including a repeater used in a mobile communication system has various shapes and structures, and usually has a structure in which a plurality of radiation elements are properly disposed on at least one reflector standing upright in a longitudinal direction.

Recently, studies are being actively conducted to achieve a compact, lightweight, and low-cost structure while satisfying high-performance requirements for a multiple-input-output (MIMO)-based antenna. In particular, in the case of an antenna device to which a patch-type radiation element for implementing linear polarization or circular polarization is applied, in general, a method of plating a radiation element made of a dielectric substrate of plastic or ceramic material and combining the radiation element with a printed circuit board (PCB) or the like through soldering is widely used.

FIG. 1 is an exploded perspective view illustrating an example of an antenna device according to the related art.

As illustrated in FIG. 1, in an antenna device 1 according to the related art, a plurality of radiation elements 35 are arranged to be exposed to a front side of an antenna housing body 10, which is a beam output direction, so that beams are output in a desired direction to facilitate beam forming, and for protection from the external environment, a radome 50 is mounted on a front end portion of the antenna housing body 10 with a plurality of radiation elements 35 interposed therebetween.

More specifically, the antenna device 1 according to the related art is provided in a shape of a thin rectangular parallelepiped enclosure whose front surface is opened, and includes an antenna housing body 10 integrally formed with a plurality of heat dissipation fins 11 provided on a rear surface thereof, a main board 20 stacked on the rear surface of the inside of the antenna housing body 10, and an antenna board 30 stacked on the front surface of the inside of the antenna housing body 10.

The patch-type radiation element or a dipole-type radiation element 35 may be mounted on the front surface of the antenna board 30, and the radome 50 that protects each internal part from the outside and allows radiation from the radiation elements 35 to be smoothly performed may be installed on a front surface of the antenna housing body 10.

However, in one example of the antenna device 1 according to the related art, since a front portion of the antenna housing body 10 is shielded by the radome 50, the radome 50 itself serves as an element for inhibiting front heat dissipation of the antenna device. In addition, since the radiation elements 35 are also designed to only transmit and receive RF signals, heat generated from the radiation elements 35 is not radiated forward. For this reason, there is a problem that the heat dissipation efficiency is greatly reduced because heat generated from a high heating element inside the antenna housing body 10 may be inevitably uniformly discharged to the rear of the antenna housing body 10. To solve this problem, demand for a new heat dissipation structure design is increasing.

In addition, according to one example of the antenna device 1 according to the related art, due to a volume of the radome 50 and a volume occupied by an arrangement structure in which the radiation element 35 is spaced apart from the front surface of the antenna board 30, it is very difficult to implement a slim-sized base station required for in-building or 5G shadow areas.

DISCLOSURE

Technical Problem

The present invention has been made to solve the above technical problem, and an object of the present invention provides an antenna RF module capable of greatly improving heat dissipation performance by removing a radome and disposing the antenna RF module outside an antenna housing so that the antenna RF module is exposed to the outside air and enabling distributed heat dissipation to the front and rear of the antenna housing, an RF module assembly, and an antenna device including the same.

In addition, another object of the present invention provides an antenna RF module including a reflector that stably protects an RF filter inside, performs a ground function between a radiation element and the RF filter, easily dissipates heat generated by the RF filter to the outside, and grounds (GND) the radiation element, and an antenna device including the same.

Objects of the present invention are not limited to the above-mentioned technical objects. That is, other objects that are not mentioned may be obviously understood by those skilled in the art from the following description.

Technical Solution

According to the present invention, an antenna RF module includes an RF filter which has at least four outer side surfaces, a radiation element module which is disposed on one surface of the outer side surfaces of the RF filter, an amplifier substrate which is disposed on another surface of the outer side surfaces of the RF filter and on which an analogue amplification element is mounted, and a reflector which is disposed between the RF filter and the radiation element module to ground (GND) the radiation element module and also mediate the outwardly dissipating heat generated by the RF filter, wherein socket pins are coupled to a main board disposed at an antenna housing in a unit of a module.

The unit of the module before coupling of a socket pin to the main board may be defined as an assembly in which the RF filter is closely installed on a rear surface of the reflector and then the radiation element module is closely installed on a front surface of the reflector so that an electrical signal is connected to the RF filter.

The amplifier substrate may be provided inside an amplifier substrate body disposed parallel to the RF filter, and the RF filter and the amplifier substrate body may be electrically connected to each other through sliding coupling.

The RF filter and the amplifier substrate may be electrically connected by a coaxial connector when the RF filter is slidably coupled to the amplifier substrate body.

The RF filter and the reflector may be coupled by a pem nut.

The reflector may be provided with a plurality of installation holes through which the RF filter is installed by penetrating from front to rear and a bending coupling part bent rearward at an end portion of an inner edge of the plurality of installation holes, and after the pem nut is fastened to a pem nut fixing hole penetrating in a front-rear direction of the bending coupling part, the RF filter may be coupled by an operation in which a filter fixing screw penetrating through the RF filter penetrates through the pem nut from the front to the rear and is fastened.

The reflector may be stacked on and coupled to a front surface of the RF filter, and a plurality of heat sinks may be integrally formed on a rear surface of the reflector so as to protrude rearward to accommodate the RF filter.

The reflector may be stacked on and coupled to a rear surface of the RF filter, and a plurality of heat sinks may be integrally formed on a front surface of the reflector so as to protrude forward to accommodate the RF filter.

The reflector may be provided in plurality to correspond to the number of the RF filters, and may be coupled to shield front surfaces of each of the RF filters, and portions in contact with each of the reflectors may be provided to come into contact in a zigzag curved shape.

The reflector may be provided with a plurality of heat dissipation holes, and the plurality of heat dissipation holes may have a size of $1/10$ to $1/20$ or less of a distance of the radiation element module when the distance of the radiation element module is arranged at half-wavelength ($1/2\lambda$) distance.

The RF filter, the radiation element module, and the amplifier substrate may be manufactured in plurality in an array form in an up-down direction or a left-right direction and coupled to a front surface of the antenna housing in the unit of the module.

The RF filter may include a filter body having a predetermined space in which the amplifier substrate is disposed; and the amplifier substrate may include a main amplifier substrate on which some of the analogue amplification elements are mounted and disposed in close contact with an inner surface of the filter body, and a sub-amplifier substrate on which the rest of the analogue amplification elements are mounted and disposed and which is stacked on the main amplifier substrate.

A metal paste via hole filled with a thermally conductive metal component may be formed in a portion of the main amplifier substrate on which the analogue amplification element is mounted.

The analogue amplification element mounted on the amplifier substrate may include an RFIC element.

The RF filter may include a filter body employed as either a cavity filter or a dielectric ceramic filter, and a filter heat sink panel made of a thermally conductive material may be further provided on at least one of both surfaces of the filter body.

An FPGA module including an FPGA substrate having an FPGA element separated from the main board mounted therein may be disposed on one side of the RF filter, and a socket pin may be coupled to the main board.

The FPGA module may include an FPGA module body in which the FPGA substrate is disposed, and an element heat sink panel may be disposed on at least one of both end surfaces of the FPGA module body.

A male socket part may be provided at an end portion of the amplifier substrate for coupling of a socket pin to the main board, the male socket part may be provided with a plurality of RF transmission lines and ground (GND) terminal lines, and banking processing may be performed between terminal pins related to the plurality of RF transmission lines and a terminal pin related to the ground (GND) terminal line.

According to another embodiment of the present invention, an antenna RF module assembly includes: a plurality of RF filters each having at least four outer side surfaces; a plurality of radiation element modules which are disposed on one surface of outer side surfaces of each of the plurality of RF filters; an amplifier substrate which is disposed on another surface of the outer side surfaces of each of the plurality of RF filters and on which an analogue amplification element is mounted; and a reflector which is disposed between the plurality of RF filter and the plurality of radiation element modules to ground (GND) the radiation element module and mediate dissipation of heat generated by the RF filter to an outside, in which socket pins may be coupled to a main board disposed at an antenna housing in a unit of a module.

According to still another of the present invention, an antenna device includes: a main board on which at least one digital element is mounted on a front surface or a rear surface; an antenna housing which has a shape of an enclosure whose front is opened so that the main board is installed therein; and an RF module assembly which is connected to the main board through an electrical signal line, in which the RF module assembly includes: a plurality of RF filters each having at least four outer side surfaces; a plurality of radiation element modules which is disposed on one surface of outer side surfaces of each of the plurality of RF filters; an amplifier substrate which is disposed on another surface of the outer side surfaces of each of the plurality of RF filters and on which an analogue amplification element is mounted; and a reflector which is disposed between the plurality of RF filter and the plurality of radiation element modules to ground (GND) the radiation element module and mediate dissipation of heat generated by the RF filter to an outside, and socket pins are coupled to a main board disposed at an antenna housing in a unit of a module.

Advantageous Effects

According to an embodiment of an antenna RF module, an RF module assembly, and an antenna device including the same according to the present invention, the following various effects can be achieved.

First, by spatially separating heat generated by heating elements of the antenna device to enable the distributed heat dissipation toward the front and rear of the antenna device, it is possible to remarkably improve heat dissipation performance.

Second, since a radome hindering heat dissipation toward the front of the antenna is not needed, it is possible to greatly reduce manufacturing costs of products.

Third, the conventional RF-related amplification elements mounted on a main board are configured as an RF module together with an RF filter and disposed on outside the antenna housing, thereby greatly improving the overall heat dissipation performance of the antenna device.

Fourth, by separating the RF-related amplification elements from the main board, the number of layers of the main board, which is a multi-layer board, is greatly reduced, thereby reducing the manufacturing cost of the main board.

Fifth, by configuring RF components having frequency dependence as an RF module and making the RF components be detachable from the antenna housing, when individual RF components constituting the antenna device are defective or damaged, only the corresponding antenna RF module are replaced, so the maintenance and repair of the antenna device may be easily performed.

Sixth, since the distributed heat dissipation of the antenna device is possible, by reducing the length and volume of the heat sink (heat dissipation fin) integrally formed on the rear surface of the antenna housing, it is possible to facilitate the overall slim design of products.

Seventh, as heat dissipation is possible through a radiation director performing the radiation function of electromagnetic waves among the radiation element modules, it is possible to maximize a heat dissipation area of the front surface of the antenna device.

The effects of the present invention are not limited to the above-described effects. That is, other effects that are not described may be obviously understood by those skilled in the art from the claims.

<Description of Reference Signs>

Figure 1:
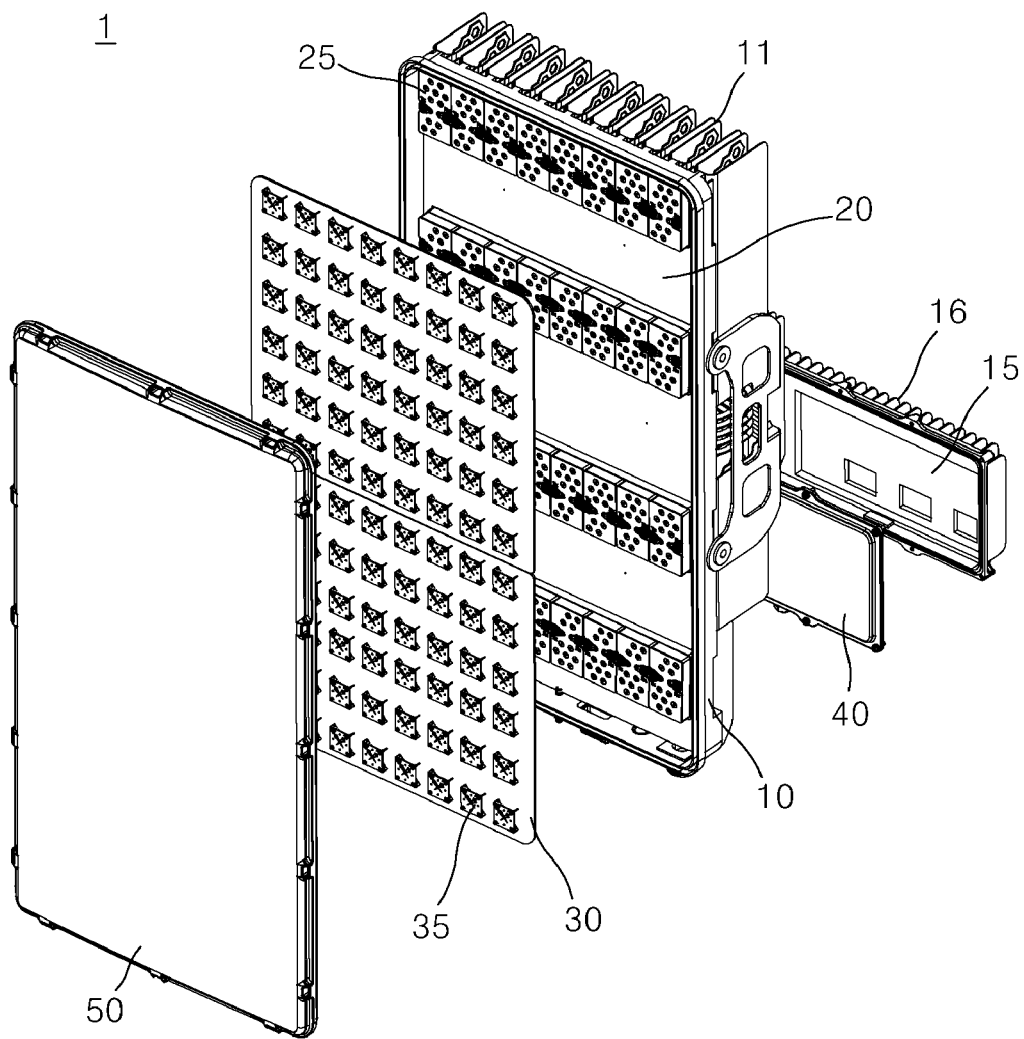
FIG. 1 is an exploded perspective view illustrating an example of an antenna device according to the related art.

100: Antenna device
105: Antenna housing
110: Rear housing
110S: Internal space
111: Rear heat dissipation fin
120: Main board
125: Female socket part
128a: First heating element
128b: Second heating element
130: Front housing
140: RF filter
141: Filter body
142a: Screw through-hole
143: Partition wall
146: Amplifier substrate
146': Male socket part
146a-1, 146a-2: PA element
146c: LNA element
147: Fixed boss
148: Heat sink panel
149a: Screw fixing hole
149b: Screw through-hole
150: Reflector
151: Antenna arrangement part
155: Plurality of heat dissipation hole
157: Boss through-hole
160: Radiation element module
161: Radiation element module cover
162: Printed circuit board
163a: Antenna patch circuit part
163b: Feeding line
165: Radiation director
166: Reinforcing rib
167: Director fixing part -continued <Description of Reference Signs>

168: Director fixing protrusion
200: RF module
300: Amplifier module
500: Outer mounting member

BEST MODE

Hereinafter, an antenna RF module, an RF module assembly, and an antenna device including the same according to an embodiment of the present invention will be described in detail with reference to the accompanying drawings.

It is to be noted that in giving reference numerals to components of each of the accompanying drawings, the same components will be denoted by the same reference numerals even though they are illustrated in different drawings. Further, in describing exemplary embodiments of the present disclosure, well-known constructions or functions will not be described in detail in the case in which it is decided that they may unnecessarily obscure the understanding of exemplary embodiments of the present disclosure.

Terms 'first', 'second', A, B, (a), (b), and the like, will be used in describing components of exemplary embodiments of the present disclosure. These terms are only for distinguishing the components from other components, and the nature, sequence, order, or the like of the components are not limited by the terms. In addition, unless defined otherwise, all the terms used in the present specification, including technical and scientific terms, have the same meanings as meanings that are generally understood by those skilled in the art to which the present disclosure pertains. It should be interpreted that terms defined by a generally used dictionary are identical with the meanings within the context of the related art, and they should not be ideally or excessively formally interpreted unless the context clearly dictates otherwise.

The present invention is based on a technical idea that a radome of a conventional antenna device is not necessarily provided, and RF-related amplification elements mounted on a main board inside an antenna housing are configured as an RF module together with an RF filter to spatially separate heat generated from various heating elements of the antenna device. Hereinafter, an antenna RF module, an RF module assembly, an antenna device including the same, and a method of assembling an antenna RF module will be described based on an embodiment illustrated in the drawings.

Figure 2:
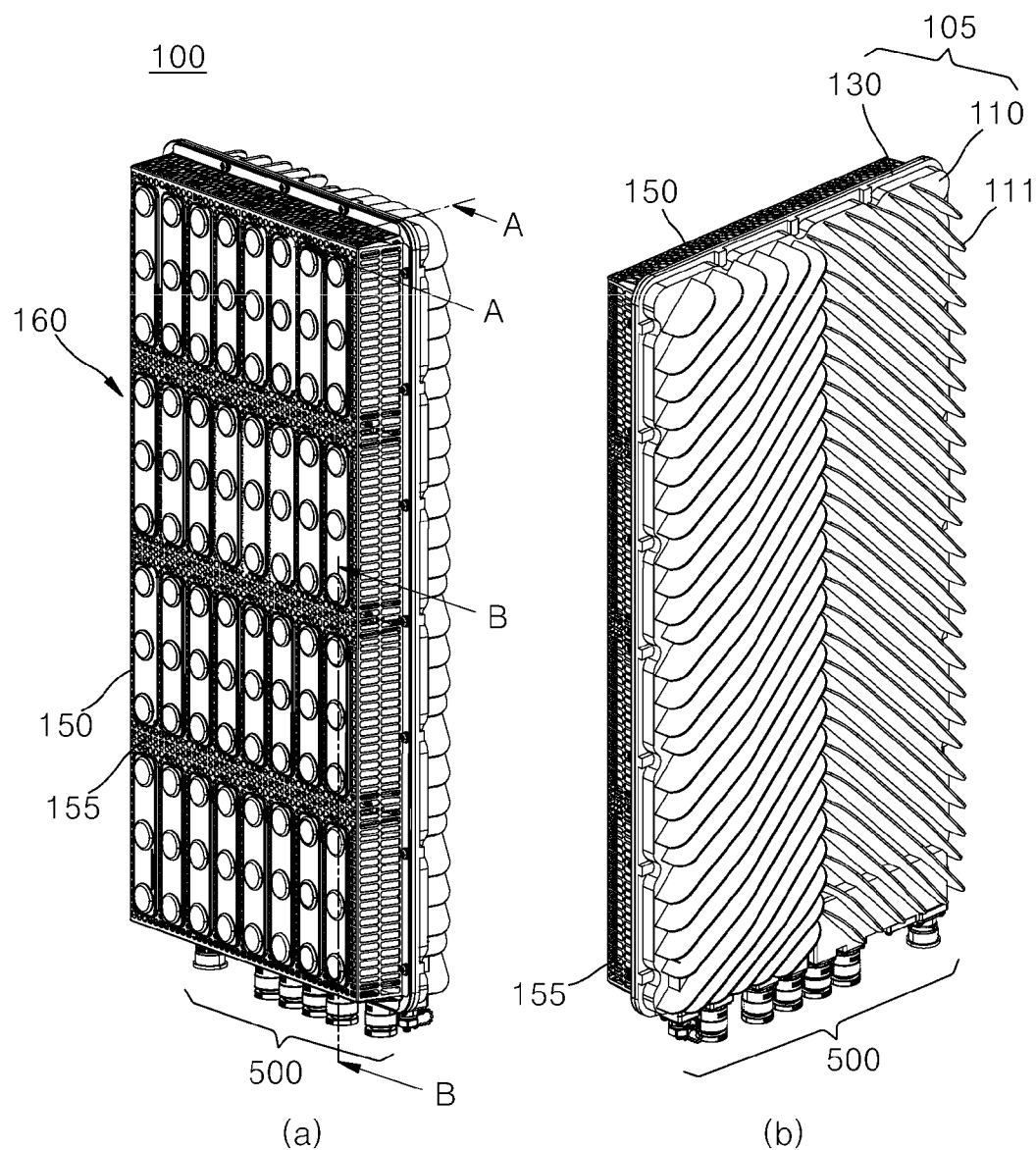
FIG. 2 is a front perspective view and a rear perspective view illustrating the antenna device according to an embodiment of the present invention.
Figure 3A:
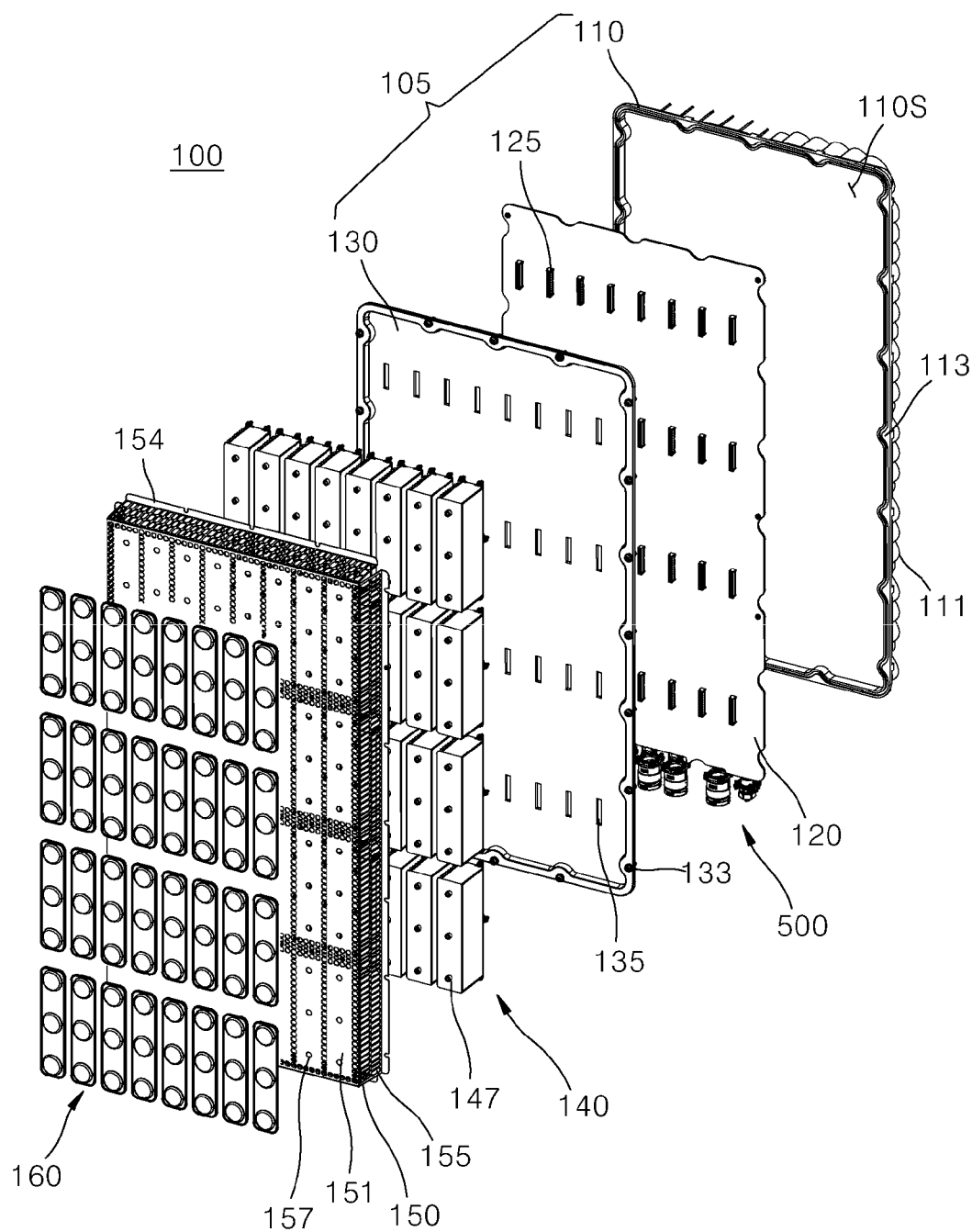
FIGS. 3A and 3B are an exploded perspective view of a front portion and an exploded perspective view of a rear portion of FIG. 2.
Figure 3B:
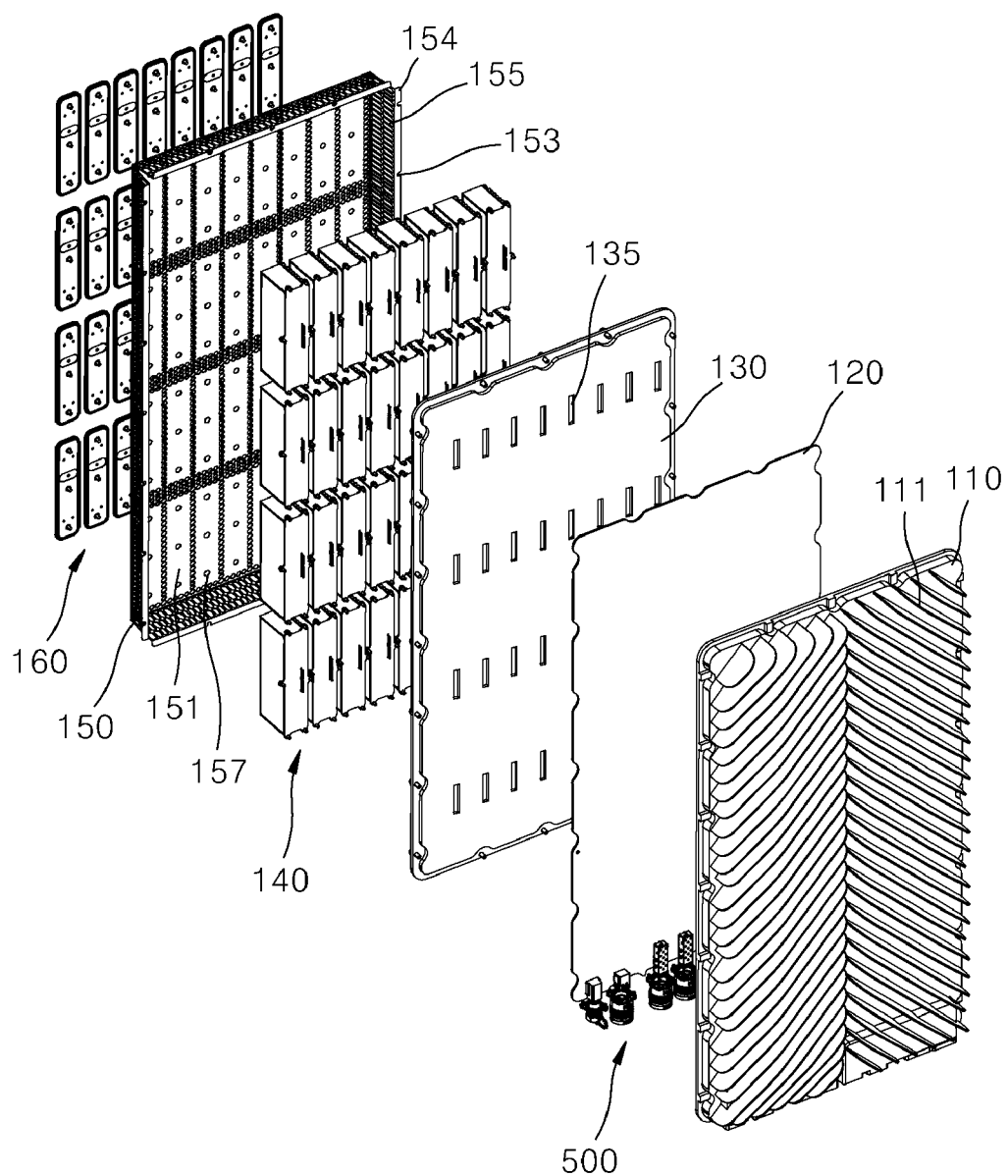
Figure 4:
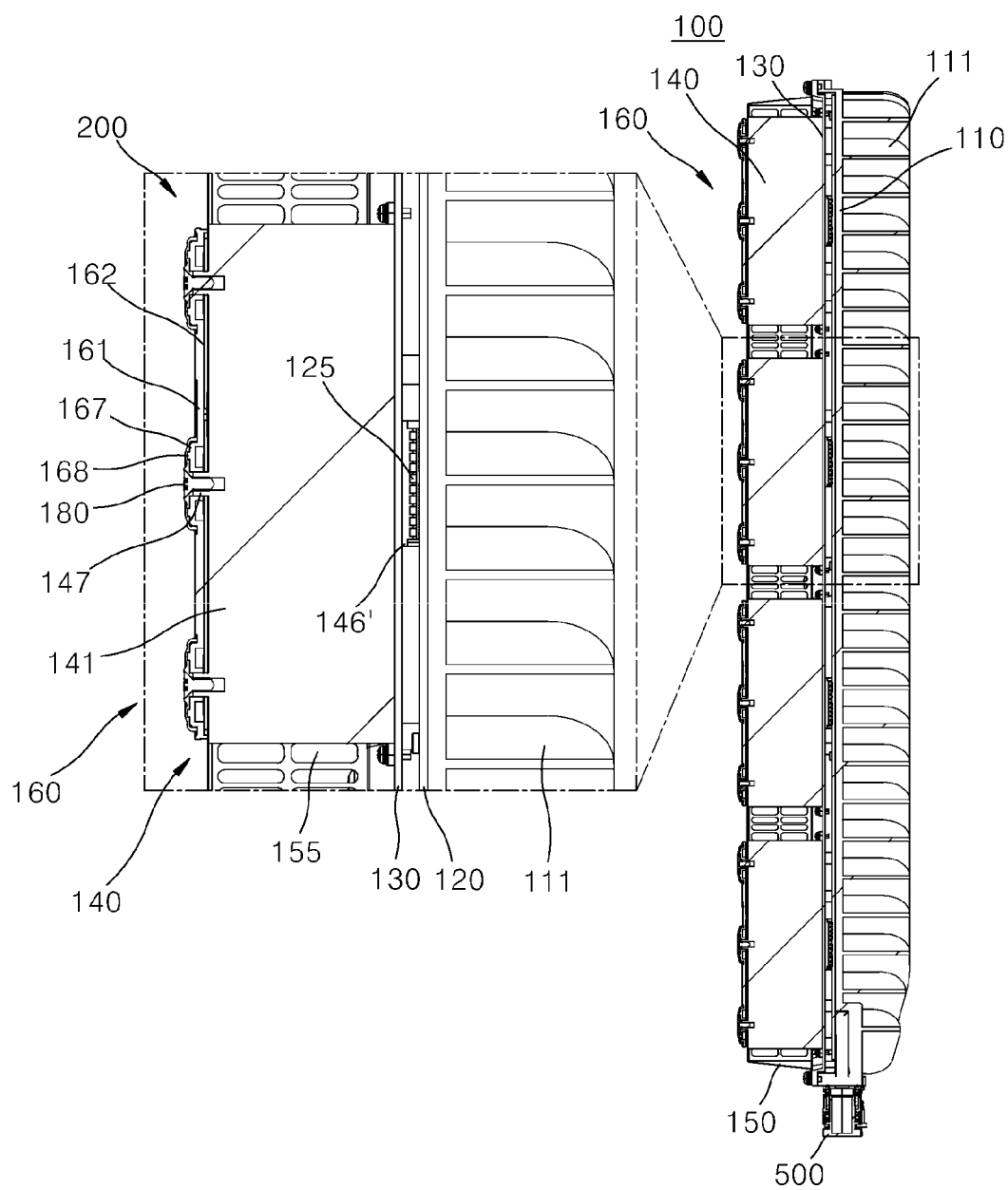
FIG. 4 is a cross-sectional view taken along line A-A in FIG. 2 and a partially enlarged view thereof.
Figure 5:
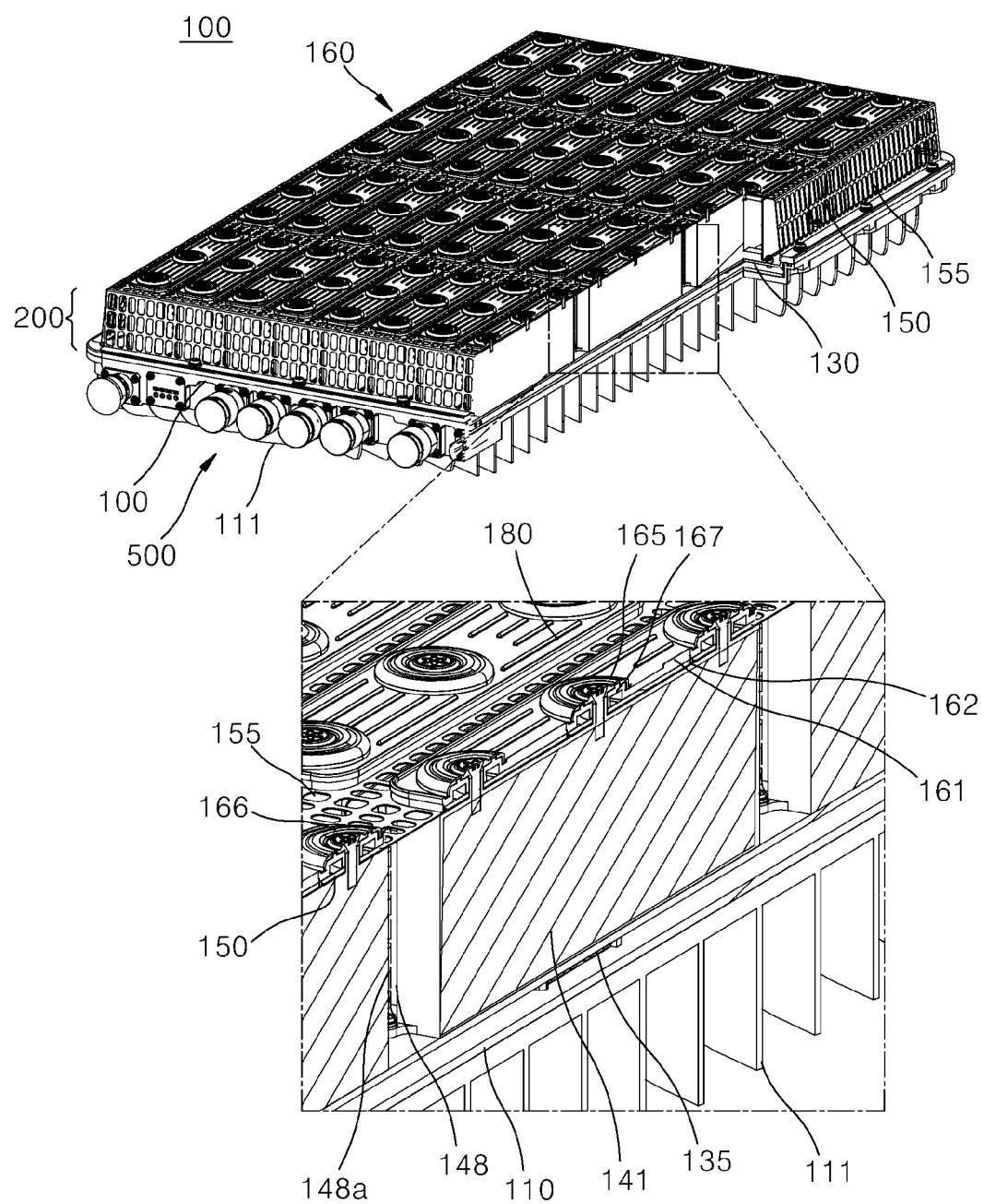
FIG. 5 is a partially cutaway perspective view taken along line B-B in FIG. 2 and a partially enlarged view thereof.
Figure 6:
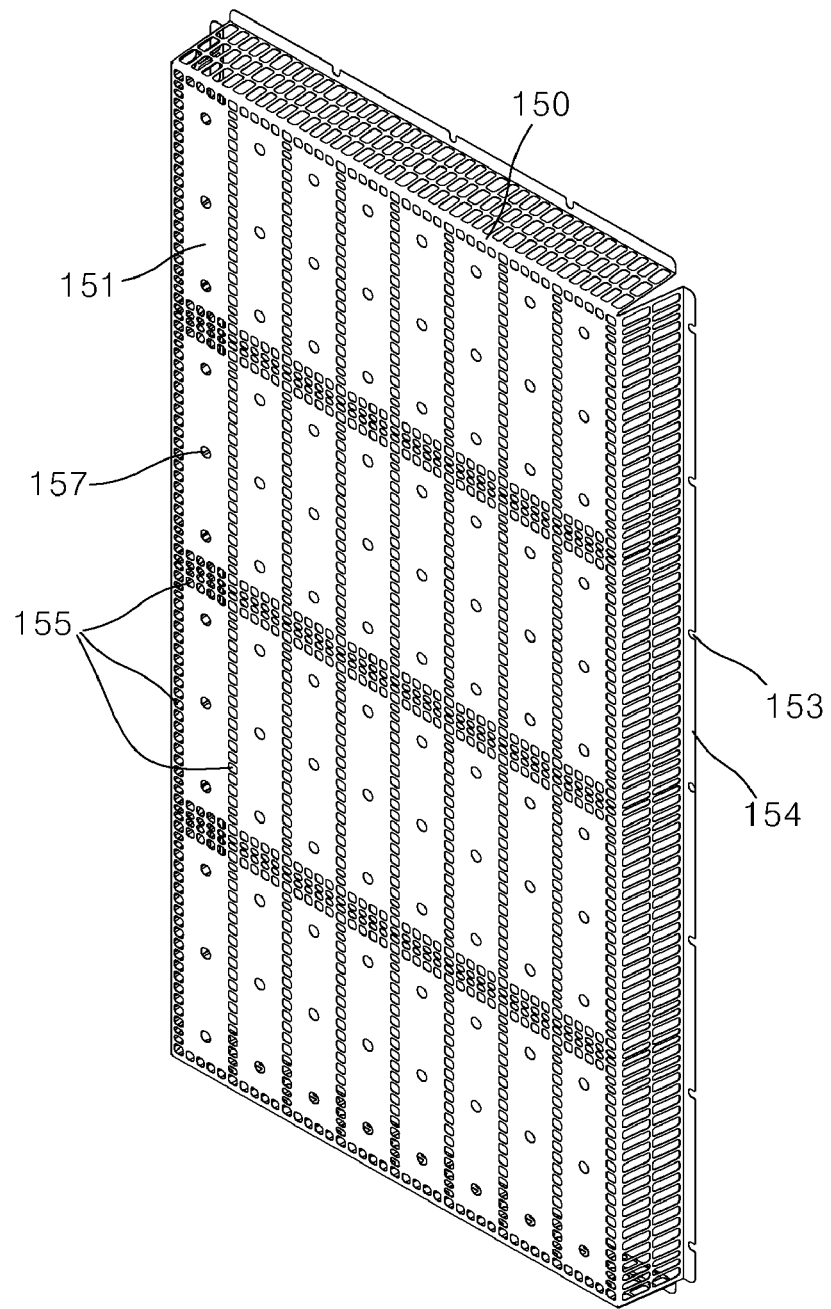
FIG. 6 is a perspective view illustrating a reflector in the configuration of FIG. 2.

FIGS. 2A and 2B are a front perspective view and a rear perspective view illustrating an antenna device according to an embodiment of the present invention, FIGS. 3A and 3B are an exploded perspective view of a front portion and an exploded perspective view of a rear portion of FIG. 2, FIG. 4 is a cross-sectional view taken along line A-A in FIG. 2 and a partially enlarged view thereof, FIG. 5 is a partially cutaway perspective view taken along line B-B in FIG. 2 and a partially enlarged view thereof, and FIG. 6 is a perspective view illustrating a reflector in the configuration of FIG. 2.

Referring to FIGS. 2 to 5, an antenna device 100 according to an embodiment of the present invention includes an antenna housing 105 forming an appearance of the antenna device. The antenna housing 105 includes a rear housing 110 forming an appearance of a rear side of the antenna device 100 and a front housing 130 forming an appearance of a front side of the antenna device 100.

In addition, the antenna device 100 according to an embodiment of the present invention is stacked on a main board 120 closely installed in an internal space 110S of the antenna housing 105 and an antenna RF module (radio frequency module) 200 (hereinafter, abbreviated as an RF module) which is stacked on a front surface of the front housing 130.

The antenna housing 105 is coupled with the RF module 200 to form the appearance of the entire antenna device 100 and, although not illustrated, may serve to mediate the coupling to a holding pole provided for installation of the antenna device 100. However, unless the installation space of the antenna device 100 is restricted, the antenna housing 105 does not necessarily have to be coupled to the holding pole, and can be directly installed and fixed in a wall-mounted type on a vertical structure such as an inner or outer wall of a building. In particular, the antenna device 100 according to an embodiment of the present invention has a great meaning in that it is designed to be slim to minimize the front and rear thickness, so that wall-mounted type installation is easier. This will be described in more detail later.

The antenna housing 105 is made of a metal material with excellent thermal conductivity so that heat dissipation is advantageous as a whole, and is formed in a shape of a rectangular parallelepiped enclosure having a thin thickness in a front-rear direction, and although not illustrated in the drawing, includes a predetermined internal space 110S by opening a front surface of the rear housing 110 to serve to mediate the installation of the main board 120 on which digital elements (e.g., field programmable gate array (FPGA) element and/or power supply unit (PSU) element) or the like are mounted.

Meanwhile, although not illustrated in the drawing, an inner side surface of the rear housing 110 may be formed in a shape matching an external protruding shape by the digital element (FPGA element, etc.) and/or PSU element or the like that is mounted on a rear surface of the main board 120. This is to maximize heat dissipation performance by increasing a thermal contact area with the rear surface of the main board 120.

Although not illustrated in the drawing, a handle part that may be gripped by a worker in the field to transport the antenna device 100 according to an embodiment of the present invention or facilitate manual mounting of the antenna device 100 on a holding pole (not illustrated) or an inner or outer wall of a building can be further installed may be further installed on left and right sides of the antenna housing 105.

In addition, various kinds of outer mounting members 500 for cable connection with a base station device (not illustrated) and adjustment of internal parts may be penetrated and assembled on an outside of a lower end portion of the antenna housing 105.

Referring to FIG. 2, a plurality of rear heat dissipation fins 111 may be integrally formed on a rear surface of the rear housing 110 to have a predetermined pattern shape. Here, the heat generated from the main board 120 installed in the internal space 110S of the rear housing 110 may be directly dissipated rearward through the plurality of rear heat dissipation fins 111.

The plurality of rear heat dissipation fins 111 are disposed to be inclined upward toward left and right ends based on the middle of left and right widths (refer to FIG. 2B), and may be designed so that heat is more quickly dissipated by forming an ascending current in which the heat dissipated to the rear is distributed in a left-right direction of the rear housing 110, respectively. However, the shape of the rear heat dissipation fin 111 is not necessarily limited thereto. For example, although not illustrated in the drawing, when a blowing fan module (not illustrated) is provided on the rear surface side of the rear housing 110, the rear heat dissipation fin 111 may be formed in parallel to the left and right ends, respectively, in the blowing fan module disposed in the middle so that the heat dissipated by the blower fan module is discharged more quickly.

In addition, although not illustrated in the drawing, a mounting part (not illustrated) to which a clamping device (not illustrated) for coupling the antenna device 100 to the holding pole (not illustrated) is coupled may be integrally formed in some of the plurality of rear heat dissipation fins 111. Here, the clamping device may be configured to rotate the antenna device 100 according to the embodiment of the present invention installed on a tip portion thereof in a left-right direction or tilt and rotate the antenna device 100 in an up-down direction to adjust directionality of the antenna device 100.

However, the clamping device for tilting and rotating the antenna device 100 is not necessarily coupled to the mounting part. For example, when the antenna device 100 is installed in a wall-mounted type on an inner or outer wall of a building, a clasp plate-shaped clamp panel that is easily coupled in a wall-mounted type can be coupled to the mounting portion.

Hereinafter, the antenna RF module 200 according to the present invention will be described in more detail with reference to the accompanying drawings.

The RF module 200 may include an RF filter 140, a radiation element module 160, and an amplifier substrate 146. In addition, the RF module 200 may further include a reflector 150 serving as a ground (GND) of the radiation element module 160. However, the reflector 150 does not serve only as a ground for the radiation element module 160, but the RF filter 140 exposed to front outside air defined as the front of the front surface of the front housing 130 among the antenna housings 105 described below may also serve to protect the filter 140 from the outside.

The RF module 200 configured as described above may be stacked on the front surface of the main board 120 via the front housing 130 among the antenna housings 105 as illustrated in FIGS. 2 to 5.

In the antenna device 100 according to the embodiment of the present invention, the RF filter 140 is provided in plurality to form one component of the antenna RF module assembly.

Here, as illustrated in FIGS. 2 and 3, a total of eight RF filters 140 are arranged adjacently in the left-right direction, and each of the plurality of RF filters 140 are arranged in a total of four rows in the up-down direction, respectively. However, it is not necessarily limited thereto, and it goes without saying that the arrangement position and the number of RF filters 140 may be variously designed and modified.

In addition, in one embodiment of the present invention, it will be described as an example that the RF filter 140 is a cavity filter in which a predetermined cavity is formed on one side and a resonator composed of a dielectric resonator (DR) or a metallic resonator rod is provided in the space. However, the RF filter 140 is not limited thereto, and various filters such as a dielectric filter may be employed.

In addition, the plurality of radiation element modules 160 are coupled to correspond to the number of each of the plurality of RF filters 140, and each of the radiation element modules 160 implements 2T2R. Accordingly, the antenna device 100 according to an embodiment of the present invention illustrates a model in which a total of 64T64R is implemented, but is not limited thereto.

Meanwhile, as described above, the RF module 200 is arranged to cover the plurality of RF filters 140 and may further include a reflector 150 serving as a ground for the plurality of radiation element modules 160. To this end, the reflector 150 is preferably made of a metal material.

Here, the reflector 150 may further function as a reflection layer of the radiation element module 160. Accordingly, the reflector 150 may concentrate the RF signal by reflecting the RF signal output from the radiation element module 160 in a direction corresponding to a directing direction.

In addition, the reflector 150 may perform a heat dissipation function for the outside air of the system heat as a function specific to the RF module 200 according to the embodiment of the present invention.

To this end, the reflector 150 may be formed in a mesh shape in which a plurality of heat dissipation holes 155 are perforated, as illustrated in FIG. 6. The plurality of heat dissipation holes 155 are configured to communicate the inside and outside of the reflector 150, and may serve as a heat discharge hole for discharging heat generated by the RF filter 140 located in the rear space of the reflector 150 to the outside of the reflector 150. Accordingly, it is possible to actively use outside air for heat dissipation of the antenna device 100.

Meanwhile, a size of the heat dissipation hole 155 may be properly designed by simulating the durability and heat dissipation characteristics of the reflector 150. In particular, a size between the heat dissipation holes 155 may be designed in consideration of a wavelength of frequency to maintain a smooth ground (GND) function. For example, the size of the heat dissipation holes 155 may be set to have a size within a range of $1/10\lambda$ to $1/20\lambda$ of the operating frequency.

Here, the distance $1/10\lambda$ is meaningful as an upper limit threshold for serving as a sufficient ground (GND) of the radiation element module 160, and the distance $1/20\lambda$ is meaningful as a lower limit threshold for securing a minimum flow of outside air through the heat dissipation hole 155 of the reflector 150.

Therefore, the size of the heat dissipation hole 155 is preferably formed to have a range greater than $1/20\lambda$ of the operating frequency and smaller than $1/10\lambda$ of the operating frequency.

In particular, the reflector 150 may be provided in a singular number between the plurality of RF filters 140 and the plurality of radiation element modules 160 in terms of the ground (GND) function and may be defined as a configuration to perform a common ground function.

More specifically, as illustrated in FIG. 6, the reflector 150 may be formed in the shape of a rectangular metal plate body stacked on a front end of the plurality of RF filters 140. An antenna arrangement part 151 on which each heat dissipation element module 160 to be described later is seated may be formed on a front surface of the reflector 150 to correspond to a position of the RF filter 140 in a planar shape. Here, the antenna arrangement part 151 is formed in a planar shape, and thus, is seated so that a front surface of the filter body 141 in the configuration of the rear RF filter 140 is in thermal contact with a surface and a rear surface of the front radiation element module 160 is in thermal contact with the surface, thereby improving the heat dissipation performance by a heat conduction method.

In addition, as illustrated in FIG. 6, in the reflector 150, an edge bending plate 154 which surrounds and protects side portions of the plurality of RF filters 140 coupled to the front surface of the front housing 130 may be formed by bending each edge portion rearward, a plurality of screw fixing grooves 153 may be formed to be spaced apart from each other at a plurality of places along the edge of the edge bending plate 154, and the plurality of screw fixing grooves 153 and a plurality of screw through-holes 133 formed along the edge of the front housing 130 may be fastened to the front of the front housing 130 by an operation of a plurality of assembly screws (reference numerals not indicated).

Referring to FIGS. 2 to 5, the antenna RF module 200 may be detachably coupled to the antenna housing 105. The antenna RF module 200 may be physically coupled to the front housing 130 through bolting (or screw coupling) or the like, and the amplifier substrate 146 constituting the antenna RF module 200 may be detached from the main board 120 by a socket pin coupling method. Specifically, the male socket part 146' of FIG. 12A to be described later is provided on the amplifier substrate 146, and a female socket part 125 to which the male socket part 146' of the amplifier substrate 146 is coupled by the socket pin may be provided on the front surface of the main board 120. The specific configuration and function of the amplifier substrate 146 will be described in more detail later.

Referring to FIGS. 3A and 3B, the front housing 130 serves to partition between the main board 120 installed and seated in the internal space 110S of the antenna housing 105 and the RF module 200 stacked on the front surface thereof. In addition, the front housing 130 is partitioned so that the internal space 110S on the antenna housing 105 side and other spaces are distinguished, and thus, may perform a thermal blocking and separation function so that the heat generated in the internal space 110S on the antenna housing 105 side does not affect the RF filter 140 side.

Here, it is preferable to understand that the meaning of the thermal blocking is to block the heat generated from the RF module 200 located on the front outside air (or front space) defined as the front of the front surface of the front housing 130 from being intruded into a rear surface space (i.e., the internal space 110S of the rear housing 110) of the front housing 130, and it is preferable to understand that the meaning of the thermal separation is to separate and dispose the thermal components to enable the front heat dissipation as well as the rear heat dissipation by separating some of the plurality of heating elements intensively and dispersedly mounted on the front and rear surfaces of the main board 120 initially stacked in the internal space 110S of the rear housing 110.

In addition, in the current market situation in which there are numerous manufacturers of the antenna devices and the components or equipment included therein, from the manufacturer's point of view which manufactures only the RF module 200, there is an advantage in establishing a new market environment as the plurality of RF modules 200 are temporarily assembled in the front housing 130, or distribution and sales are possible in units of modules that can be temporarily assembled.

In the front housing 130, the plurality of screw through-holes 133 for screw fixing of the reflector 150 may be formed at a plurality of places along the edge. In addition, the front housing 130 may be provided with at least through slits 135 so that the male socket part 146' formed in the amplifier substrate 146 of the RF filter 140 penetrates therethrough and is coupled to the female socket part 125 of the main board 120 by the socket pin.

Here, since it is exposed to the outside through the heat dissipation hole 155 of the reflector 150 described above, when the antenna device 100 according to the embodiment of the present invention is installed outside a building (i.e., outdoors), rainwater may seep into the antenna unit during rainy weather, and thus, a waterproof gasket ring (not illustrated) may be interposed between the rear surface edge of the front housing 130 and the front surface edge of the rear housing 110 to prevent inflow of rainwater, etc. In addition, front and rear surfaces of the plurality of through slits 135 penetrating through the front housing 130 may each be provided with a foreign substance inflow prevention ring (not illustrated) that protects the male socket part 146' of the amplifier substrate 146 penetrating through the front and rear surfaces from the outside and preventing foreign substances such as rainwater from flowing into the internal space 110S of the rear housing 110 therethrough.

In this way, the antenna device 100 according to an embodiment of the present invention employs a simple socket pin coupling method in constructing a predetermined electrical signal line between the main board 120 and the RF filter 140, so there is no need to use a separate coaxial connector (direct coaxial connector (DCC)) for electrical connection between the conventional RF filter 140 and the main board 120, thereby significantly reducing the manufacturing costs of the product.

However, it will be understood that the adoption of the socket pin coupling method of the RF filter 140 creates an effective effect in terms of the electrical coupling, and in order to prevent any flow of the RF filter 140 in terms of the physical coupling, it goes without saying that a plurality of screw fastening methods can be additionally employed. For example, as illustrated in FIGS. 12A and 12B described later, by a screw fastening method to the front housing 130 using a fixing screw 142 through a plurality of screw through-holes 142a formed at the edge of the rear end portion of the filter body 141 in the configuration of the RF filter 140, it is possible to create a more robust fixation effect.

Figure 7:
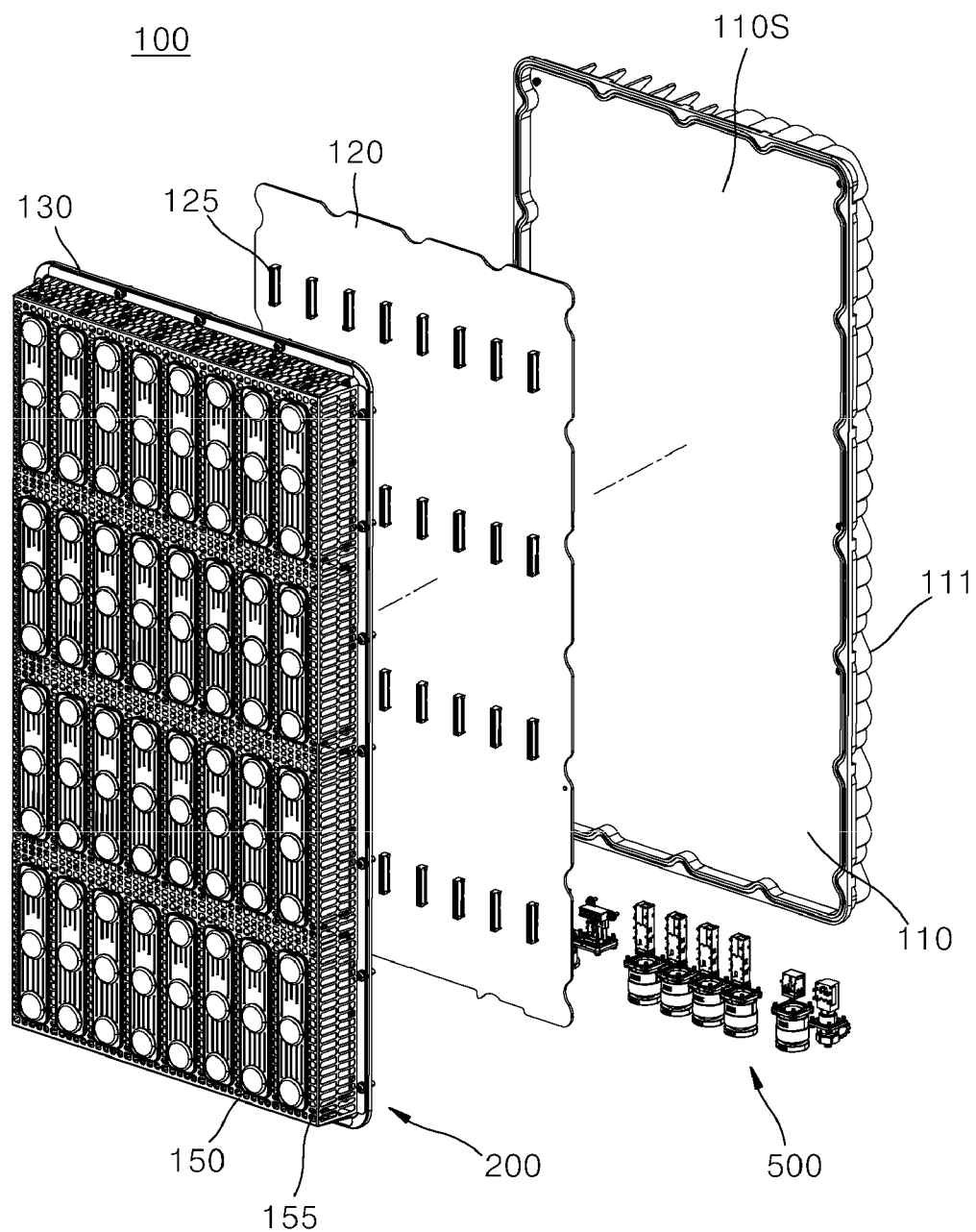
FIG. 7 is a perspective view illustrating an installation of a main board on a rear housing in the configuration of FIG. 2.
Figure 8:
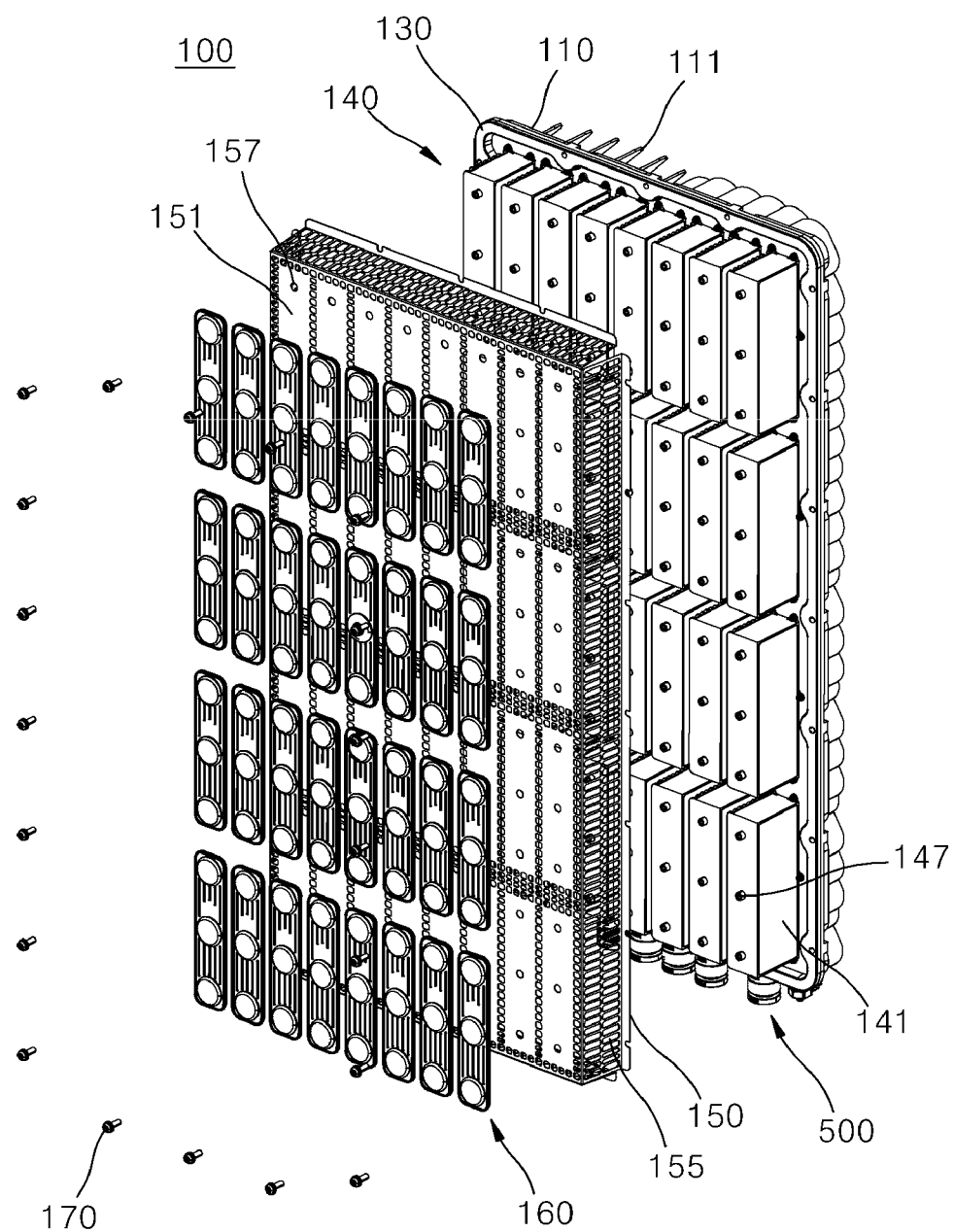
FIG. 8 is an exploded perspective view illustrating an installation of an RF module on the main board in the configuration of FIG. 2.
Figure 9:
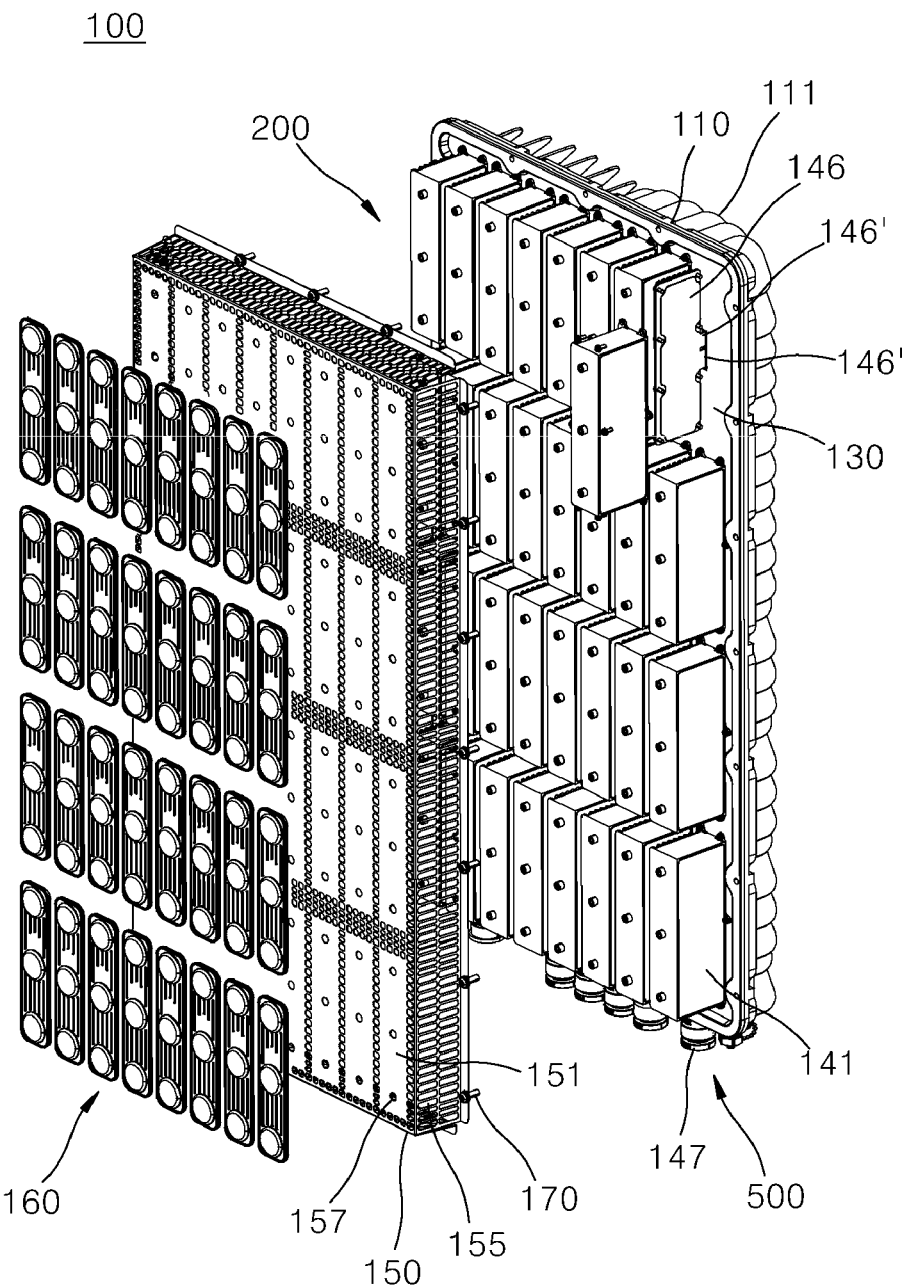
FIG. 9 is a perspective view illustrating a state in which a filter body is separated from the rear housing during the installation process of FIG. 8.
Figure 10:
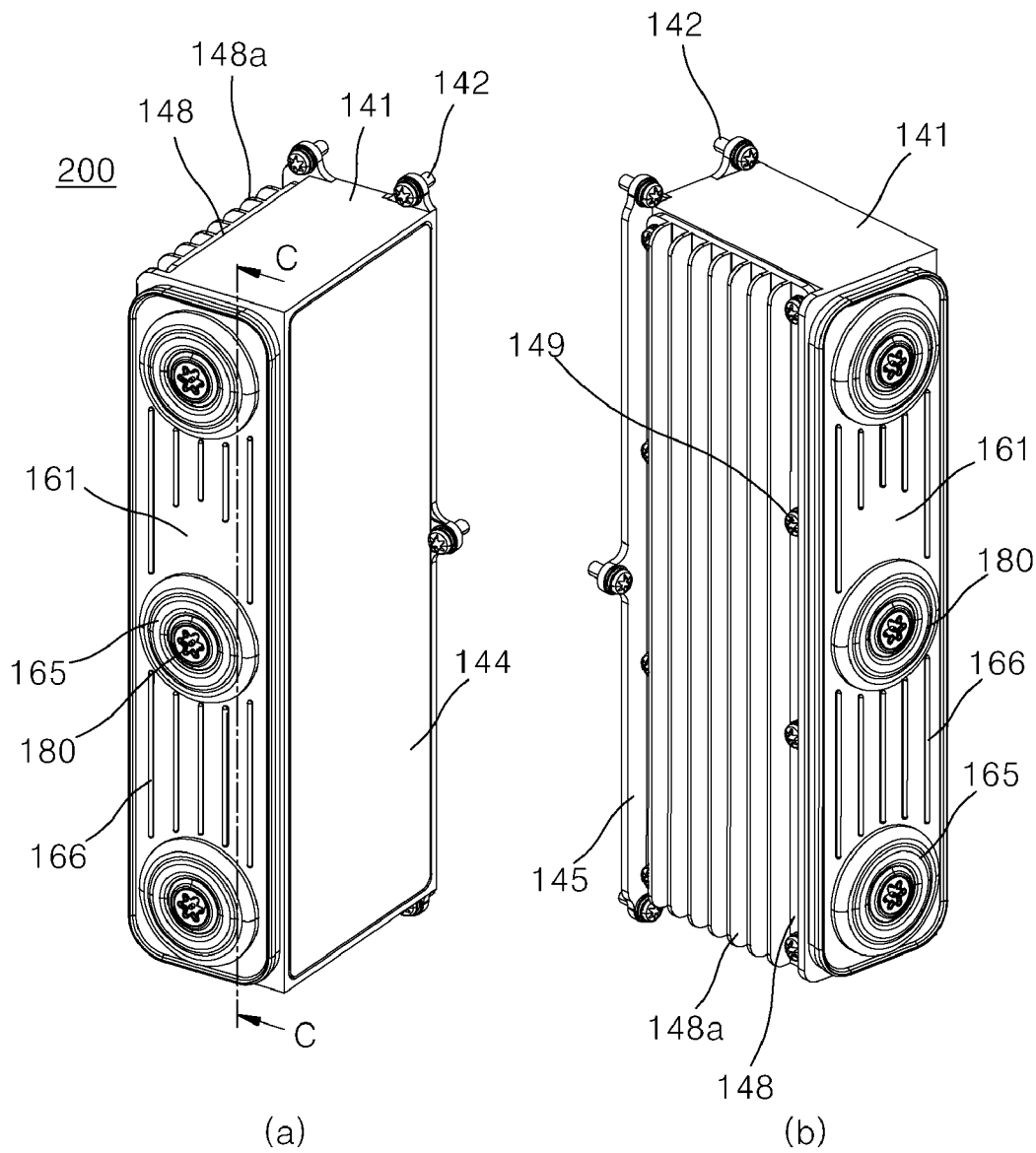
FIG. 10 is a perspective view illustrating the RF module in the configuration of FIG. 8.
Figure 11:
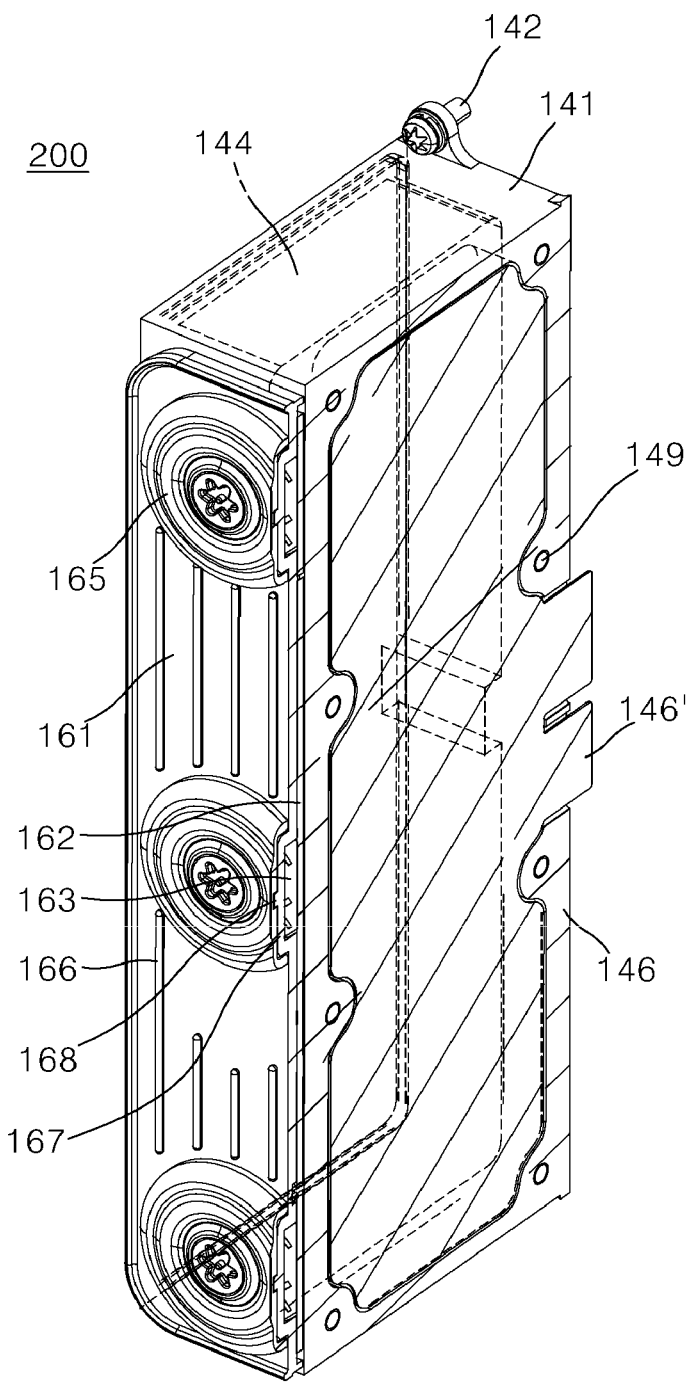
FIG. 11 is a cross-sectional view taken along line C-C of FIG. 10, and is a projected cutaway perspective view in which an internal appearance is partially projected.
Figure 12A:
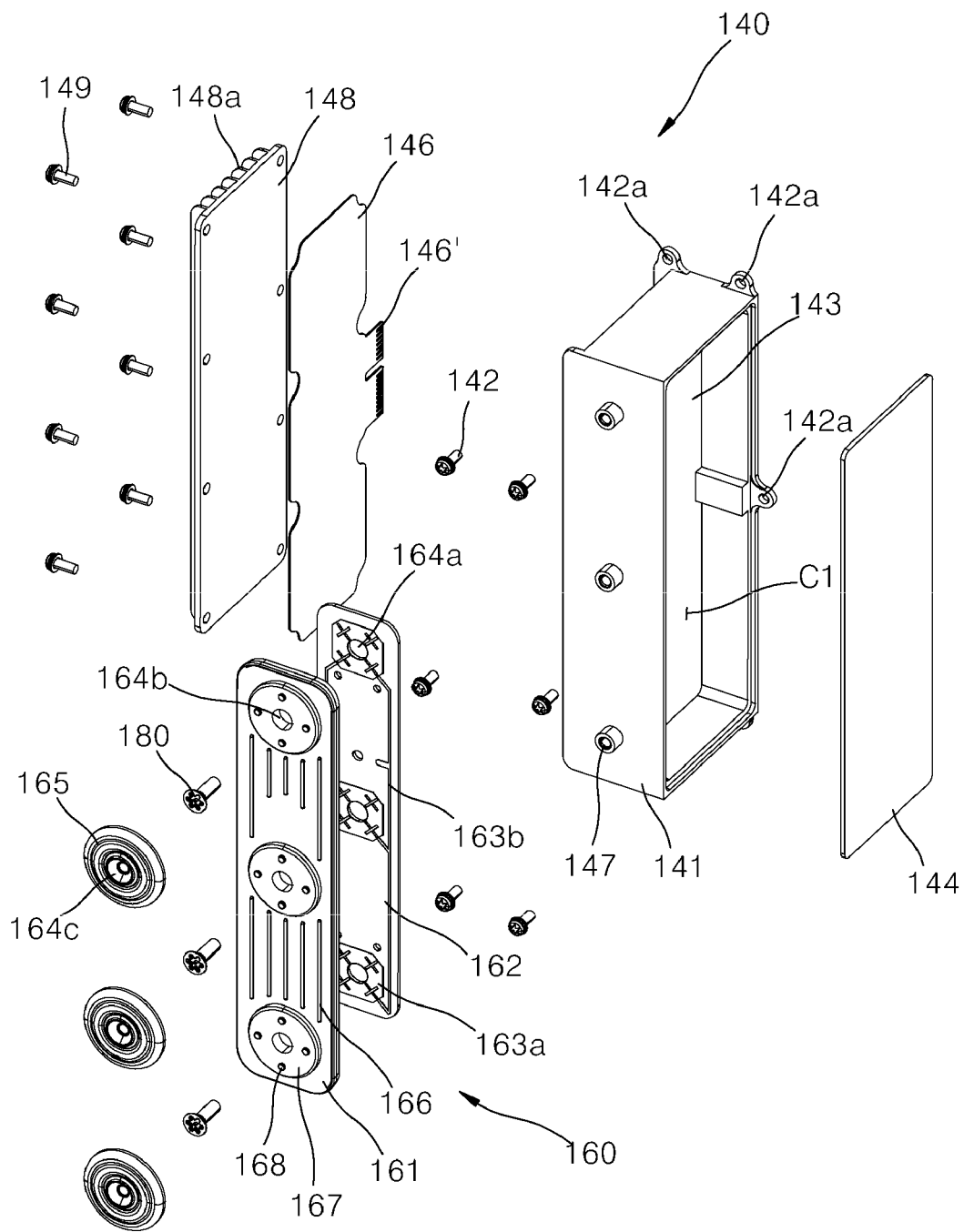
FIGS. 12A and 12B are exploded perspective views illustrating the RF module of FIG. 10.
Figure 12B:
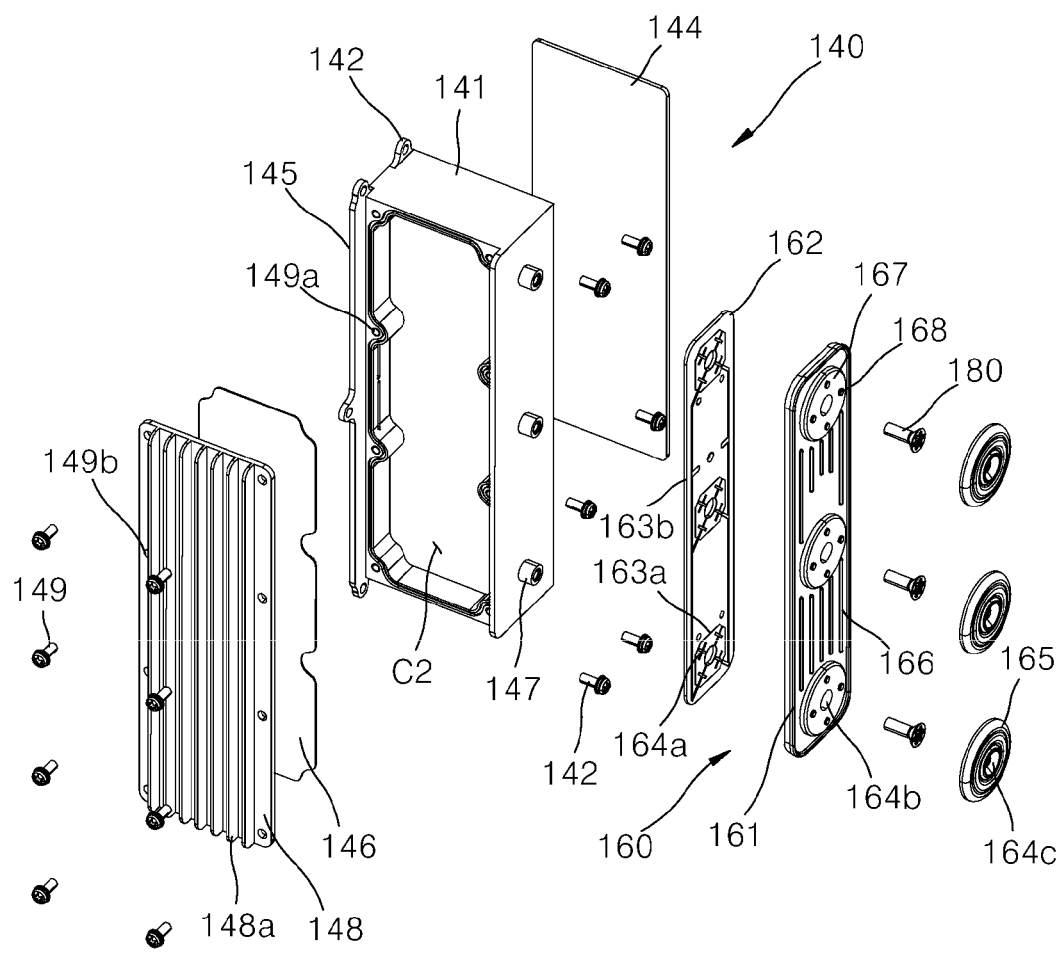
Figure 13:
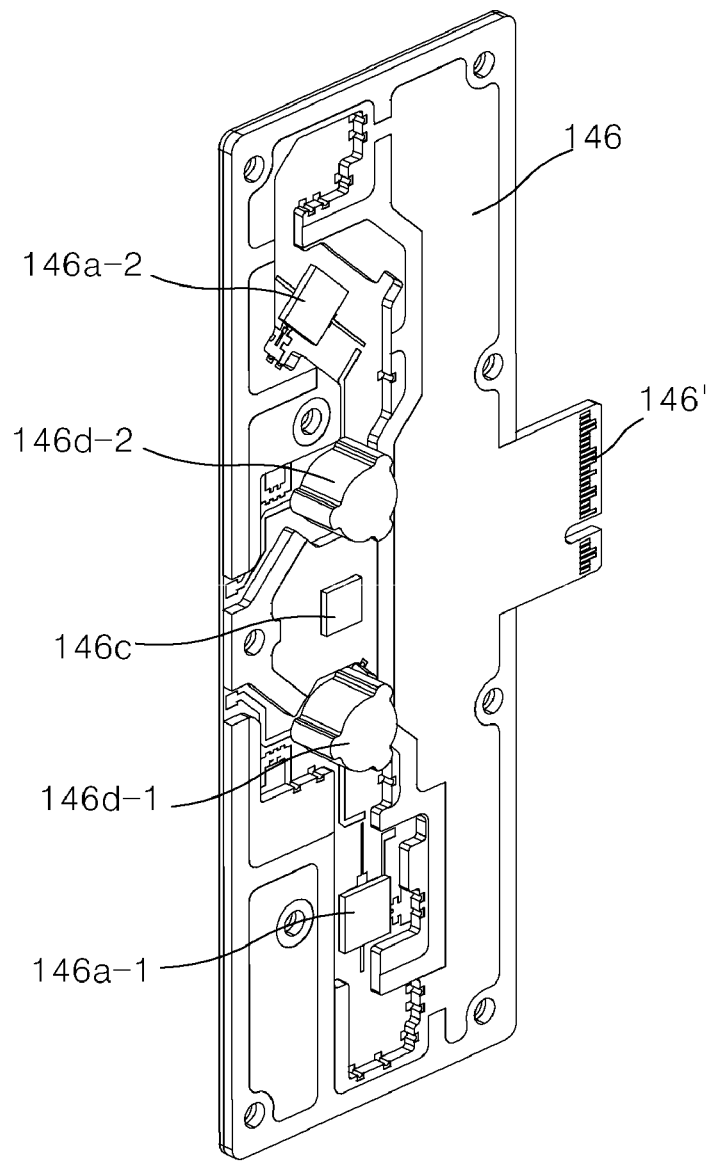
FIG. 13 is a detailed view of an amplifier substrate in the configuration of the RF module of FIG. 10.
Figure 14:
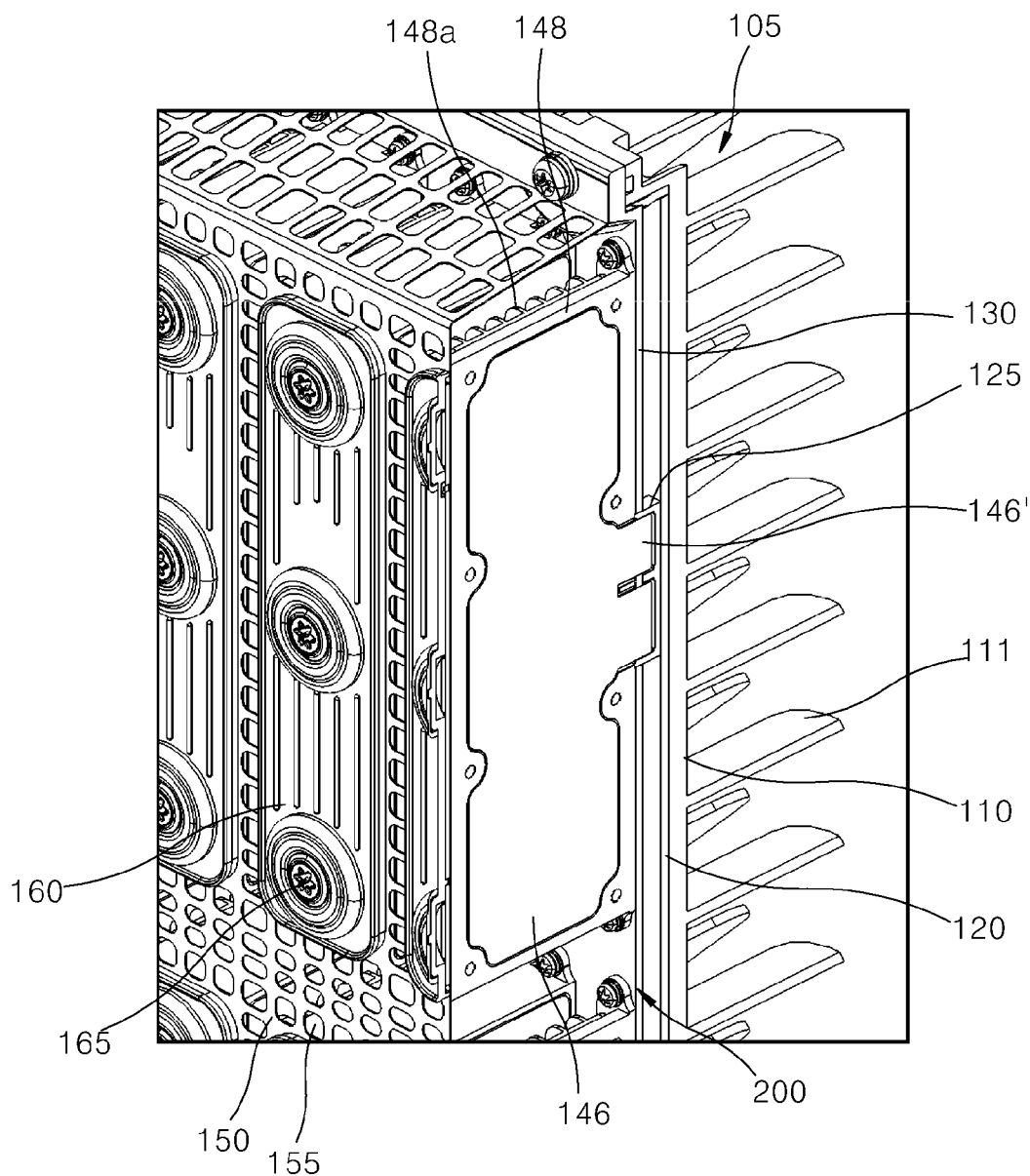
FIG. 14 is a cutaway perspective view illustrating the coupling of the amplifier substrate to the main board.
Figure 15:
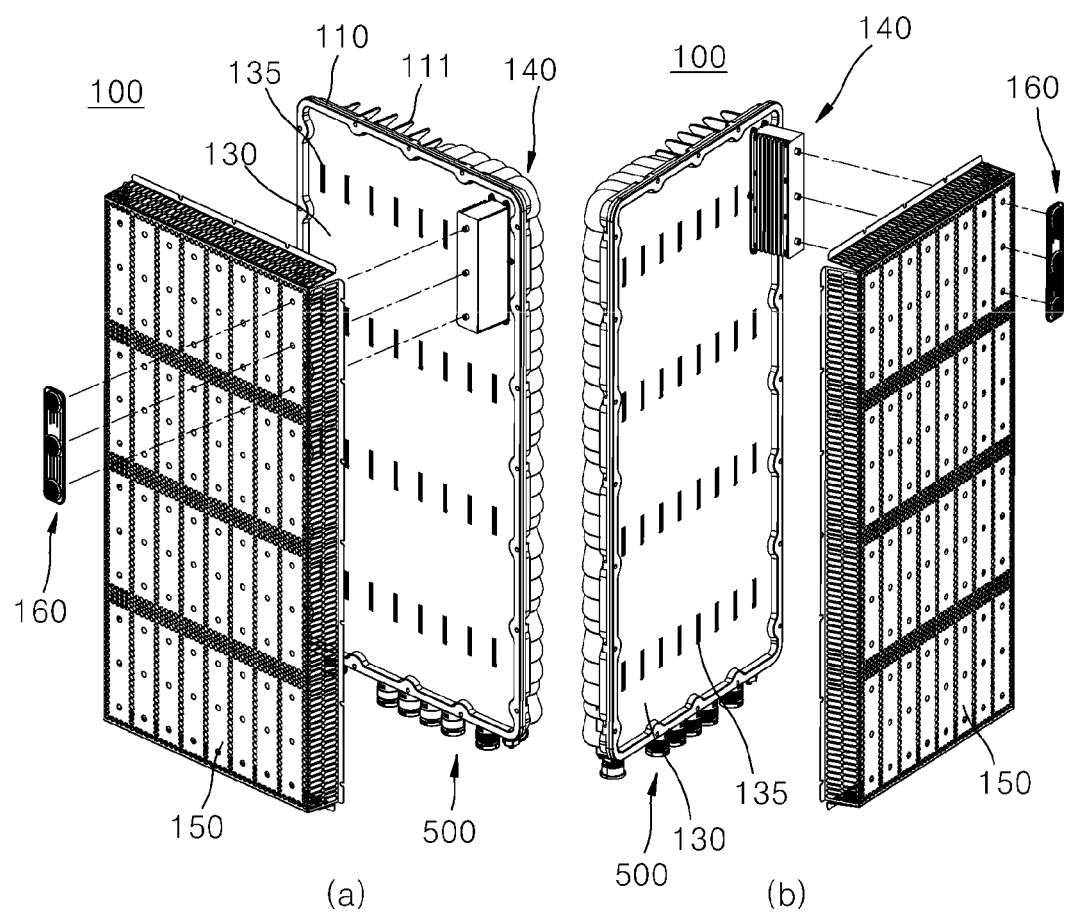
FIG. 15 is an exploded perspective view showing an assembled state of the RF module to the main board in the configuration of FIG. 3.
Figure 16:
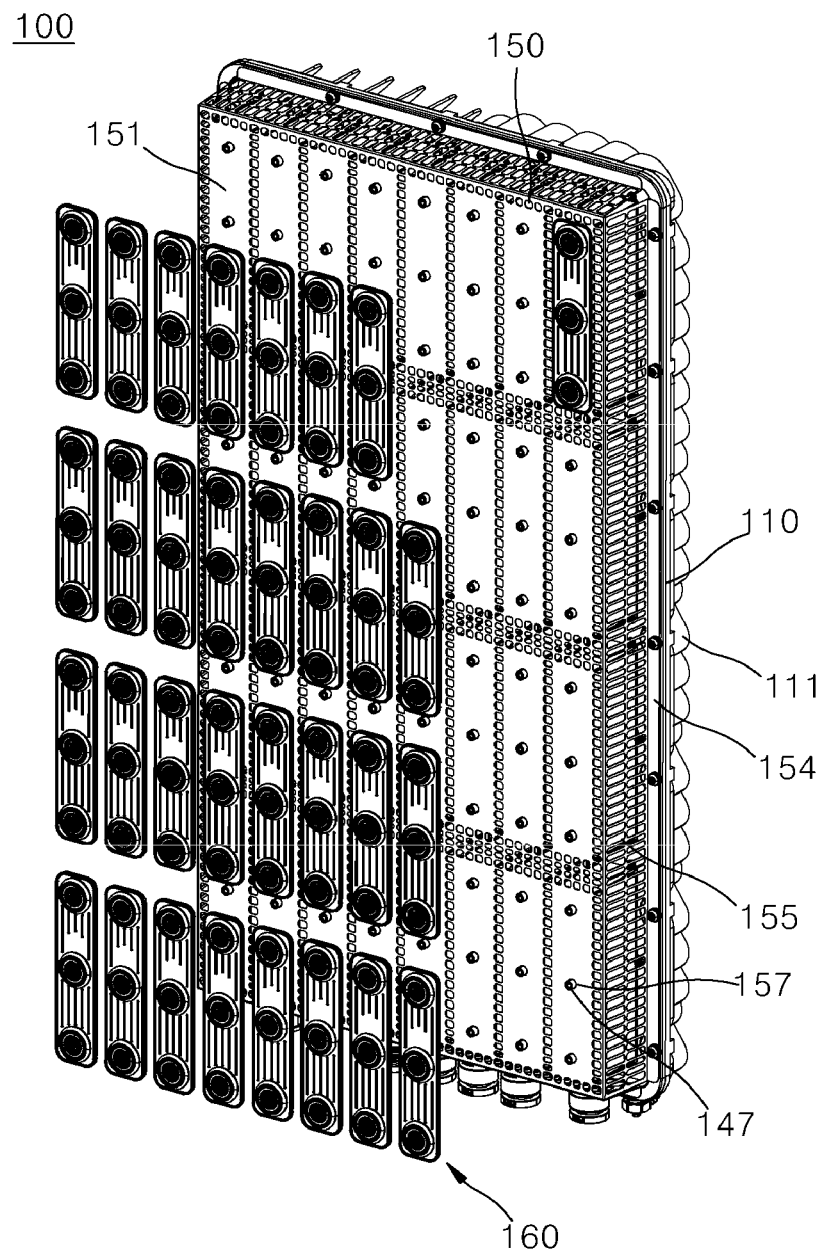
FIG. 16 is an exploded perspective view illustrating an assembled state of a radiation element module to a reflector in the configuration of FIG. 3.

FIG. 7 is a perspective view illustrating an installation of a main board on a rear housing in the configuration of FIG. 2, FIG. 8 is an exploded perspective view illustrating an installation of an RF module on the main board in the configuration of FIG. 2, FIG. 9 is a perspective view illustrating a state in which a filter body is separated from the rear housing during the installation process of FIG. 8, FIG. 10 is a perspective view illustrating the RF module in the configuration of FIG. 8, FIG. 11 is a cross-sectional view taken along line C-C of FIG. 10, and is a projected cutaway perspective view in which an internal appearance is partially projected, FIGS. 12A and 12B are exploded perspective views illustrating the RF module of FIG. 10, FIG. 13 is a detailed view of an amplifier substrate in the configuration of the RF module of FIG. 10, FIG. 14 is a cutaway perspective view illustrating the coupling of the amplifier substrate to the main board, FIG. 15 is an exploded perspective view showing an assembled state of the RF module to the main board in the configuration of FIG. 3, and FIG. 16 is an exploded perspective view illustrating an assembled state of a radiation element module to a reflector in the configuration of FIG. 3.

the antenna RF module 200 according to an embodiment of the present invention may include the RF filter 140, the radiation element module 160 disposed on one side of the RF filter 140, and the amplifier substrate 146 that is disposed on another side of the RF filter 140 and on which the analogue amplification element is mounted.

Here, the RF filter 140 may be formed to have at least four outer side surfaces. That is, the RF filter 140 has a tetrahedral shape when it has four outer side surfaces, a pentahedron shape when it has five outer side surfaces, and a hexahedron shape when it has six outer side surfaces. Therefore, hereinafter, one side and the other side of the RF filter 140 refer to any one surface of at least four outer side surfaces and the other surface excluding the one surface, and it should be understood that one side and the other side are not concepts indicating physically complete mutually opposite sides, but refer to one surface and one surface of other surfaces excluding the one surface.

Therefore, another embodiment of the antenna RF module 200 of the present invention, as illustrated in FIGS. 2 to 5 may be defined as an embodiment in which the heat generated by the RF filter 140 and the heat generated from the analogue amplification element are dissipated in different directions.

Since the antenna RF module 200 according to the present invention is a configuration in which the amplifier substrate 146 is disposed inside the RF filter 140, it goes without saying that it may be defined differently as an embodiment in which the external appearance of the RF module 200 may be configured by the RF filter 140 and the radiation element module 160 provided on the front end portion thereof.

In addition, the RF module 200 is an assembly of analog RF components. For example, the amplifier substrate 146 is an RF component equipped with an analogue amplification element for amplifying an RF signal, the RF filter 140 is an RF component for frequency filtering an input RF signal into a desired frequency band, and the radiation element module 160 is an RF component that serves to receive and transmit an RF signal.

Therefore, the antenna RF module 200 according to the present invention may be defined as follows as another embodiment.

The antenna RF module 200 according to the present invention is the antenna RF module 200 including the analog RF component, and the analog RF component includes the RF filter 140 having at least four outer side surfaces, the radiation element module 160 disposed on one of the outer side surfaces of the RF filter 140, and the analogue amplification element (not illustrated) on the amplifier substrate 146 disposed on the other one surface of the outer side surfaces of the RF filter 140.

Here, the amplifier substrate 146 may be electrically connected to the main board 120 inside the antenna housings 110 and 130. More specifically, as will be described later, the amplifier substrate 146 may be electrically connected to the main board 120 by the socket pin coupling method.

In addition, another embodiment of the antenna RF module 200 according to the present invention may be defined as a concept including the RF filter 140, the radiation element module 160 disposed on the front surface of the RF filter 140, and the reflector 150 disposed between the RF filter 140 and the radiation element module 160 to ground (GND) the radiation element module 160 and to mediate the dissipation of heat generated by the RF filter 140 to the outside.

In more detail, the antenna RF module 200 according to another embodiment of the present invention may include the RF filter 140 stacked on the front surface of the main board 120 installed in the internal space 110S of the antenna housings 110 and 130, the radiation element module 160 stacked on the front surface of the RF filter 140, and the reflector 150 disposed to cover the RF filter 140 and serving as a ground (GND) of the radiation element module 160 and mediating the dissipation of heat generated by the RF filter 140 to the outside. Here, as described above, it goes without saying that the reflector 150 may further function as a reflection layer capable of intensively irradiating radiation signals.

In particular, when it is assumed that the RF filter 140 has at least four outer side surfaces, the radiation element module 160 is stacked on one side (front surface) of the RF filter 140 and the amplifier substrate 146 is disposed on the other side of the outer side surface of the RF filter 140, so the heat generated from the amplifier substrate 146 on which at least one analogue amplification element is mounted is dissipated through one of the sidewalls of the RF filter 140 adjacent to the amplifier substrate 146 and then may be finally dissipated to the outside via the reflector 150.

Meanwhile, the antenna RF module 200 according to another embodiment of the present invention may be detachably coupled to the antenna housing 105. That is, the antenna RF module 200 according to the present invention includes the RF filter 140, the radiation element module 160 disposed on the front surface of the RF filter 140, and the reflector 150 disposed between the RF filter 140 and the radiation element module 160, and the antenna RF module 200 may be defined as another embodiment detachably coupled to the antenna housing 105. Specifically, an object to which the antenna RF module 200 is detachable is the main board 120 disposed in the internal space 110S of the rear housing 110 among the configuration of the antenna housing 105, and may be detachably coupled via the front housing 130.

Accordingly, by configuring RF components having frequency dependence as an RF module and making the RF components be detachable from the antenna housing 105, when individual RF components constituting the antenna device 100 are defective or damaged, only the corresponding antenna RF module 200 is replaced, so the maintenance and repair of the antenna device 100 may be easily performed.

In addition, the reflector 150 may be disposed to cover the RF filter 140, and may be disposed to entirely cover the exposed RF filter 140 protruding outward from the front of the front housing 130 based on the internal space 110S of the antenna housing 105. In this way, the RF filter 140 exposed to the front outside air (or front space) defined as the front of the front surface of the front housing 130 is protected from the external environment by using the reflector 150, and as described above, is designed to smoothly flow air in and out through countless heat dissipation holes 155, so it is possible to achieve higher front heat dissipation performance improvement.

Meanwhile, by being provided with the plurality of RF modules 200 implemented in various embodiments described above, it is possible to configure an antenna RF module assembly to be described later.

Referring to FIGS. 12A and 12B, the plurality of RF filters 140 may include a filter body 141 forming predetermined spaces C1 and C2 on one side and the other side in the width direction based on the partition wall 143 in the middle, respectively, a plurality of resonators (DR, not illustrated) installed in a plurality of cavities (not illustrated) provided in one (see reference numeral C1 in FIG. 12A) of the predetermined spaces C1 and C2, and the amplifier substrate 146 disposed in the other one of the predetermined spaces C1 and C2 (see reference numeral C2 in FIG. 12B) and coupled to the female socket part 125 of the main board 120 and electrically connected thereto. Here, the filter body 141 is made of a metal material and is manufactured through a die casting molding method.

The plurality of RF filters 140 may be employed and disposed as a cavity filter for filtering a frequency band of an output signal compared to an input signal through frequency adjustment using the plurality of resonators (DR) installed on the C1 side of the predetermined space. However, the RF filter 140 is not necessarily limited to the cavity filter, and as described above, a ceramic waveguide filter is not excluded.

Making the thickness of the RF filter 140 thin in the front-rear direction is advantageous in the design of slimming the entire product. In terms of the slimming design of such a product, the RF filter 140 may consider employing a ceramic waveguide filter, which is advantageous in miniaturization design, rather than a cavity filter in which the front-rear direction thickness reduction design is limited. However, in order to satisfy the high power performance of the base station antenna required in the 5G frequency environment, the accompanying antenna heat dissipation problem should be inevitably solved, and in order to effectively dissipate the heat generated inside the antenna, the adoption of the cavity filter may be preferable in that the heat generated by the RF filter 140 may be transferred to the front of the antenna housing 105 by using the RF filter 140 as a heat transfer medium.

In particular, in the antenna device 100 according to an embodiment of the present invention, the adoption of the cavity filter may be preferred in that the plurality of RF filters 140 are installed to be directly exposed to outside air away from the limited internal space 110S of the antenna housing 105 in the form of the RF module 200 and in that the heat dissipation is possible through all directions except for the installation surface of the RF filter 140. Hereinafter, the adoption of the cavity filter as the RF filter 140 in the antenna device 100 according to an embodiment of the present invention will be described as an example.

Referring to FIGS. 10 to 12B, the antenna device 100 according to an embodiment of the present invention provides the advantage of greatly improving heat dissipation performance by separately mounting an RFIC element (not illustrated), a power amplifier (PA) element, and a low noise amplifier (LNA) element, which are the RF element mounted on the front or rear surface of the conventional main board 120, on the amplifier substrate 146 of the RF filter 140 and by installing all the RF filters 140 to be exposed to outside air.

That is, conventionally, a radome installed in the front of the antenna housing not only becomes an obstacle that hinders heat dissipation toward the front side, but also has a problem in that heat concentration occurs inside the antenna housing because digital elements or PSUs with a high heating value are intensively mounted on the main board together with RF elements (RFIC, PA, and LNA elements, etc.) In addition, since the concentrated heat needs to be intensively dissipated only to the rear side of the antenna housing, heat dissipation efficiency may be greatly reduced.

However, in the case of the antenna device 100 according to an embodiment of the present invention, as illustrated in FIG. 13, by separately installing the plurality of RF modules 200 on the front regardless of the internal space 110S of the antenna housing 105 but directly exposing the plurality of RF modules 200 to outside air and adding the amplifier substrate 146 to a portion of the sidewall of the RF filter 140 to dispersedly dispose the RF elements 146a-1, 146a-2, and 146c mounted on the conventional main board, it is possible to promote the thermal dispersion and dissipate the dispersed heat to the outside more quickly.

Here, the RF elements may be the analogue amplification elements, and as described above, include the PA elements 146a-1 and 146a-2, the LNA elements 146c, and the like.

More specifically, a pair of PA elements 146a-1 and 146a-2 which are one of the analogue amplification elements and the LNA element which is one of the analogue amplification elements may be mounted on either side of both sides of the amplifier substrate 146, and a circulator 146d-1 that decouples both the PA element 146a-1 and the LNA element 146c, and a circulator 146d-2 that decouples both the PA element 146a-2 and the LNA element 146c may be circuit-connected to each other. However, it is not necessarily required that the above-described analogue amplification element be mounted on only one surface of both surfaces of the amplifier substrate 146, and it goes without saying that the above-described analogue amplification element may be dispersedly mounted on both surfaces of the amplifier substrate 146 according to embodiments.

In addition, since the amplifier substrate 146 is separately mounted on the side of the RF filter 140, the number of layers of the multi-layered main board 120 may be reduced, thereby reducing the manufacturing costs of the main board 120.

The amplifier substrate 146 is installed to be seated inside the other one C2 of the predetermined spaces C1 and C2, and may be seated so that at least the end portion of the male socket part 146' protrudes to the rear surface of the filter body 141 to be exposed.

Meanwhile, as illustrated in FIGS. 10 to 12B, the plurality of RF filters 140 may further include a filter heat sink panel 148 that dissipates the heat generated from the amplifier substrate 146 from the predetermined space C2 to the outside of the filter body 141.

A plurality of screw fixing holes 149a may be formed around the predetermined space C2 of the filter body 141, a plurality of screw through-holes 149b may be formed at the edge of the filter heat sink panel 148, and a filter heat sink panel 148 may be fixed to the filter body 141 by an operation in which the plurality of fixing screws 149 penetrates through the plurality of screw through-holes 149b on the outside of the filter body 141 and are fastened to the plurality of screw fixing holes 149a.

Here, the amplifier substrate 146 installed inside the predetermined space C2 of the filter body 141 is provided so that the outer side surface is in thermal contact with the inner side surface of the filter heat sink panel 148, so the heat generated from the amplifier substrate 146 may be thermally conducted through the filter heat sink panel 148 and may be emitted to the outside through filter heat sink fins 148a integrally formed on the outside.

Meanwhile, although not illustrated in the drawing, the antenna RF filter 140 according to the present invention may further include a heat transfer medium that is disposed between the filter heat sink panel 148 and the amplifier substrate 146 to collect heat generated from the amplifier substrate 146 and transfer the collected heat to the filter heat sink panel 148.

The heat transfer medium may be formed of any one of a vapor chamber or a heat-pipe provided to transfer heat through a phase change of a refrigerant flowing in a closed interior. When the distance between the amplifier substrate 146, which is the heat source, and the filter heat sink panel 148 is relatively small, it is preferable to employ the vapor chamber, and on the contrary, when the distance between the amplifier substrate 146 as the heat source and the filter heat sink panel 148 is relatively large, it is preferable to employ the heat-pipe.

Referring to FIGS. 10 to 12B and 14, the plurality of RF filters 140 are detachably coupled to the female socket part 125 provided on the front surface of the main board 120 using the male socket part 146' formed on the amplifier substrate 146, and may be more stably fixed by being screw-fastened to the front housing 130 using the fixing screw 142 through the plurality of screw through-holes 142*a* formed at the edge of the rear end portion of the filter body 141. Here, as illustrated in FIG. 14, since the male socket part 146' formed on the amplifier substrate 146 penetrates through the through slit 135 formed on the front surface of the front housing 130 corresponding to the external space and is coupled to the female socket part 125 by the socket pin, it has already been described that a foreign substance inflow prevention ring (not illustrated) may be interposed between the filter body 141 and the front housing 130.

Meanwhile, as illustrated in FIGS. 10 to 12B, at least one fixed boss 147 for screw fixing of the plurality of radiation element modules 160 to be described later may be installed on the front surface of the filter body 141. At least one fixed boss 147 is a part that penetrates through a boss through-hole 157 formed in the reflector 150 and is exposed through the front surface of the antenna arrangement part 151 of the reflector 150, and is fastened with the element fixing screw 180 for fixing the plurality of radiation element modules 160.

Here, at least one fixed boss 147 may be made of a metal material that is easy to conduct heat. Therefore, as described above, the filter body 141 and the fixed boss 147 are made of a metal material that is easy to conduct heat, and provides an advantage in that the heat generated from the filter body 141 is easily dissipated toward the front where the radome is removed, albeit limitedly. Furthermore, among the configurations of the radiation element module 160 described later, the radiation director 165 is also made of a metal material that is easy to conduct heat, so the front heat dissipation performance may be further improved in terms of expanding the heat dissipation area at the front. This will be described in more detail later.

To implement beamforming, as illustrated in FIGS. 2 to 5, the plurality of radiation element modules 160 are required as array antennas, and the plurality of radiation element modules 160 may generate a narrow directional beam to increase the concentration of radio waves in a designated direction. Recently, in the plurality of radiation element modules 160, a dipole-type dipole antenna or a patch-type patch antenna is used with the highest frequency, and is designed and arranged to be spaced apart so that mutual signal interference is minimized. Conventionally, generally, in order to prevent the arrangement design of such the plurality of radiation element modules 160 from being changed due to external environmental factors, the radome that protects the plurality of radiation element modules 160 from the outside is an essential component. Therefore, only for the area covered by the radome, the plurality of radiation element modules 160 and the antenna board on which the plurality of radiation element modules 160 are installed are not exposed to the outside air, so there was no choice but to be very limited in dissipating the system heat generated by the operation of the antenna device 100 to the outside.

As illustrated in FIGS. 10 to 12B, the radiation element module 160 of the antenna device 100 according to an embodiment of the present invention may include a radiation element module cover 161 that is formed vertically long and arranged on a plurality of antenna arrangement parts 151, respectively, formed on the front surface of the reflector 150, a printed circuit board 162 for the radiation element which is closely disposed on the rear surface of the radiation element module cover 161, disposed between the antenna arrangement parts 151, and printed with an antenna patch circuit part 163*a* and a feeding line 163*b*, and a radiation director 165 which is made of a conductive metal material and electrically connected to the antenna patch circuit part 163*a* of the printed circuit board 162 for the radiation element.

The above-described antenna patch circuit part 163*a*, which is a dual polarization patch element generating a dual polarization of any one of orthogonal ±45 polarization or vertical/horizontal polarization, may be printed on the front surface of the printed circuit board 162 for the radiation element. Three antenna patch circuit parts 163*a* may each be printed to be spaced apart in an up-down direction (longitudinal direction), and each antenna patch circuit part 163 may be interconnected by the feeding line 163*b*.

In the conventional antenna device, the feeding line should form a separate feeding line at the lower portion of the printed circuit board where the antenna patch circuit part is mounted. To this end, the feeding structure becomes complicated, such as having the plurality of through-holes, and the feeding structure occupies the lower space of the printed circuit board 162 for the radiation element, causing the problem of hindering direct surface thermal contact between the RF filter 140 and the printed circuit board 162 for the radiation element. However, the feeding line 163*b* according to the embodiment of the present invention is pattern-printed together with the antenna patch circuit part 163*a* on the same front surface as the printed circuit board 162 for the radiation element on which the antenna patch circuit part 163*a* is pattern-printed, so there is an advantage of making the feeding structure very simple and securing a coupling space in direct thermal contact between the RF filter 140 and the printed circuit board 162 for the radiation element.

Meanwhile, the radiation director 165 is made of a thermally conductive or conductive metal material and is electrically connected to the antenna patch circuit part 163*a*. The radiation director 165 may perform a function of inducing a radiation beam in all directions and simultaneously transferring heat generated at the rear of the printed circuit board 162 for the radiation element to the front through the thermal conduction. The radiation directors 165 may be made of a metal of a conductive material through which electricity flows well, and may be spaced apart from each other in front of each antenna patch circuit part 163*a*.

In the embodiment of the present invention, the radiation element using the antenna patch circuit part 163*a* and the radiation director 165 has been described, but when the dipole antenna is applied, the configuration of the radiation director may be omitted, and as the height of the dipole antenna is relatively high, the amount of heat dissipation may be increased by dissipating heat to a place further away from the front surface of the reflector 150.

Referring to FIGS. 4 and 10 to 12B, the radiation director 165 may be electrically connected to the antenna patch circuit part 163*a* through the director through-hole 164*c*. The overall size, shape, installation position, and the like of the radiation director 165 may be experimentally designed by measuring the characteristics of a radiation beam radiated from the corresponding antenna patch circuit part 163*a* or appropriately designed by simulating the corresponding characteristics. The radiation director 165 serves to guide the direction of the radiation beam generated from the antenna patch circuit part 163*a* in all directions, thereby further reducing the beam width of the overall antenna and improving the characteristics of the side lobe. In addition, the radiation director may compensate for loss due to the patch-type antenna and may be made of conductive metal, thereby performing the heat dissipation function. The shape of the radiation director 165 is preferably formed in an appropriate shape for inducing the direction of the radiation beam in all directions, for example, a non-directional circular shape, but is not limited thereto.

Meanwhile, at least two antenna patch circuit parts 163*a* and the radiation director 165 may constitute one radiation element module 160. FIGS. 10 to 12B illustrate an example in which three antenna patch circuit parts 163*a* and the radiation director 165 form one unit radiation element module 160, and the number of antenna patch circuit parts 163*a* and radiation directors 165 may vary according to the optimal design of the radiation element module for increasing the gain.

A through-hole 164*c* is formed in the radiation director 165, and the radiation director 165 may be electrically connected to the antenna patch circuit part 163*a* through the through-hole 164*c*. More specifically, the radiation director 165 and the antenna patch circuit part 163*a* may be electrically connected via an element fixing screw 180 provided for fixing to the front surface of the filter body 141.

Here, the radiation element module cover 161 is injection molded of a non-conductive plastic material, and as illustrated in FIGS. 12A and 12B, a director fixing part 167 that matches the rear surface of the radiation director 165 is provided on one surface of the radiation element module cover 161 and a director fixing protrusion 168 that can be coupled with the radiation director 165 may be formed in the director fixing part 167 to protrude forward.

Here, the radiation director 165 may be fixed by being press-fitted into at least one director fixing groove (not illustrated) formed to be recessed at a position corresponding to the at least one director fixing protrusion 168.

In addition, at least one substrate fixing hole 164*b* for coupling with the RF filter 140 may be formed through the radiation element module cover 161. The element fixing screw 180 may penetrate through the through-hole 164*c* of the radiation director 165 and the substrate fixing hole 164*b* of the radiation element module cover 161 through at least one substrate fixing hole 164*b*, and then may be firmly coupled to the antenna arrangement part 151 of the reflector 150 by penetrating through the substrate through-hole 164*a* formed on the printed circuit board 162 for the radiation element.

In addition, at least one reinforcing rib 166 may be formed on the front surface of the radiation element module cover 161 to form the appearance of the radiation element module cover 161, and may reinforce the strength of the radiation element module cover 161 which is a plastic material.

The RF module 200 having such a configuration may emit heat generated by the RF filter 140 corresponding to the front based on the front housing 130 to the outside through the contact with the rear surface of the reflector 150 or through the heat dissipation holes 155 formed in the reflector 150.

Meanwhile, the antenna RF module assembly according to the present invention may be defined as including the RF module 200 implemented in various forms of embodiments as follows.

As an embodiment, the antenna RF module may include the plurality of RF filters 140 detachably coupled to the front surface of the main board 120, the plurality of radiation element modules 160 stacked on the front surfaces of the plurality of RF filters 140, and the reflector 150 which is disposed to cover the plurality of RF filters 140, serves as the ground (GND) of the plurality of radiation element modules 160, and mediates the dissipation of the heat generated by the plurality of RF filters 140 to the outside.

As another embodiment, the RF module 200 includes the plurality of RF filters 140 which are disposed apart from each other by a predetermined distance in the up-down direction and the left-right direction, respectively, the plurality of radiation element modules 160 which are stacked on the front surfaces of the plurality of RF filters 140, and the reflector 150 which is disposed to partition between the plurality of RF filters 140 and the plurality of radiation element modules 160, in which the plurality of RF filters 140 may be detachably coupled to the front surface of the main board 120 stacked in the internal space 110S of the antenna housing 105 by the socket pin coupling method.

In addition, as another embodiment, the RF module 200 includes the plurality of RF filters 140 each having at least four outer side surfaces, the plurality of radiation element modules 160 which are stacked on one surface (e.g., front surface) of the outer side surfaces of each of the plurality of RF filters 140, the amplifier substrate 146 which is disposed on the other one surface of the outer side surfaces of each of the plurality of RF filters 140 and has at least one analogue amplification element mounted thereon, and the reflector 150 which is disposed between the plurality of RF filters 140 and the plurality of radiation element modules 160 to serve as a common ground for the plurality of radiation element modules 160, in which the heat generated from at least one analogue amplification element may be dissipated through one of the sidewalls of the plurality of RF filters 140 and then dissipated forward through the reflector 150.

Finally, as another embodiment, the RF module 200 includes the plurality of RF filters 140 which is detachably coupled to the front surface of the main board 120 and each has at least four outer side surfaces, the plurality of radiation element modules 160 which is stacked on one surface (e.g., front surface) of the outer side surfaces of each of the plurality of RF filters 140, and the reflector 150 which is disposed to cover the plurality of RF filters 140, in which the reflector 150 serves to ground between the plurality of RF filters 140 and the plurality of radiation element modules 160, is made of a metal material to reflect electromagnetic waves irradiated from the radiation element module 160 to the front, and may be implemented in a form in which the plurality of heat dissipation holes 155 are formed to dissipate heat generated from the plurality of RF filters 140 to the front or side.

The assembling process of the RF module 200 and the antenna device 100 according to an embodiment of the present invention configured as described above will be briefly described with reference to the accompanying drawings (particularly, FIG. 7 below).

First, as illustrated in FIGS. 10 to 13, in one embodiment of the method of assembling an antenna RF module 200 according to the present invention, the amplifier substrate 146 on which the analogue amplification element is mounted is coupled to one of one side or the other side of the filter body 141 manufactured by die casting. Next, after disposing the reflector 150 having the plurality of heat dissipation holes 155 formed on the front surface of the RF filter 140, the printed circuit board for the radiation element of the radiation element module 160 is disposed on the reflector 150. After disposing the radiation element module cover 161 of the radiation element module 160 on the printed circuit board 162 for the radiation element, by assembling the radiation director 165 of the radiation element module 160 to the radiation element module cover 161 and electrically connecting the radiation director 165 and the printed circuit board 162 for the radiation element, the RF module 200 assembly is completed. Later, the amplifier substrate 146 is attached to the front surface of the main board 120 by the socket pin coupling method.

Meanwhile, according to an embodiment of the method of assembling an antenna device 100 according to the present invention, as illustrated in FIGS. 8, 9, and 13, after fixedly coupling the front housing 130 to the front end of the rear housing 110 so that the internal space 110S of the antenna housing 105 in which the main board 120 is installed and the external space are completely partitioned, the male socket part 146' of the amplifier substrate 146 of the plurality of RF modules 200 is coupled to the female socket part 125 of the main board 120 by the socket pin coupling method.

Referring to FIG. 14, when the reflector 150 is screwed along the edge end portion of the rear housing 110, and then each of the plurality of radiation element modules 160 is coupled to the antenna arrangement part 151, the assembly of the antenna device 100 is completed.

Figure 17:
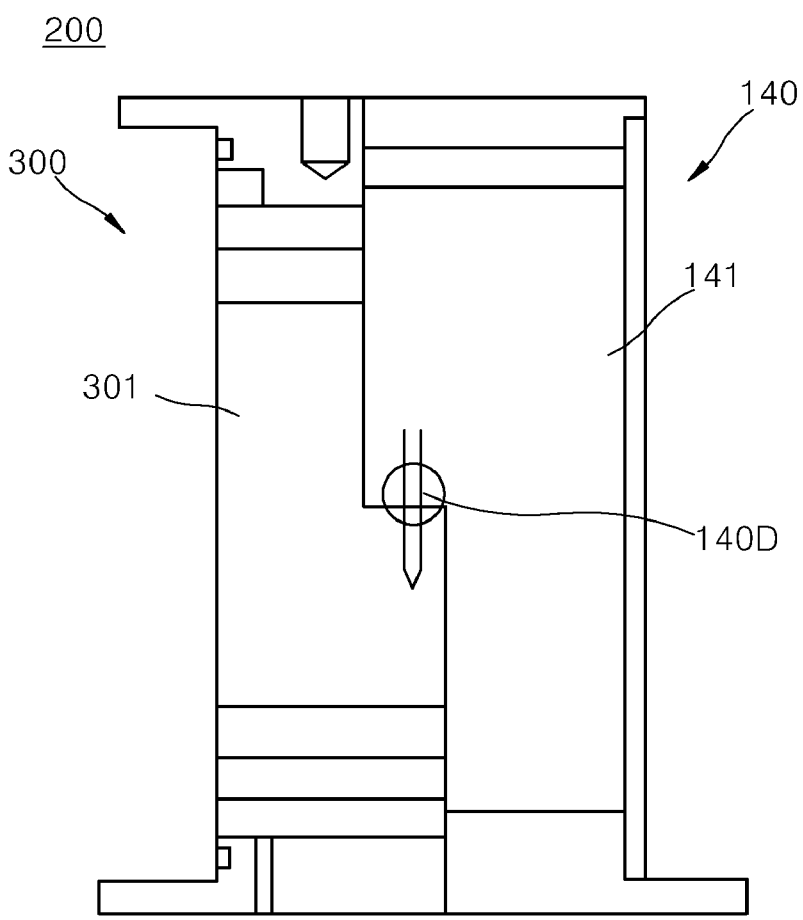
FIG. 17 is a conceptual diagram illustrating a modification of an RF module according to an embodiment of the present invention.
Figure 18:
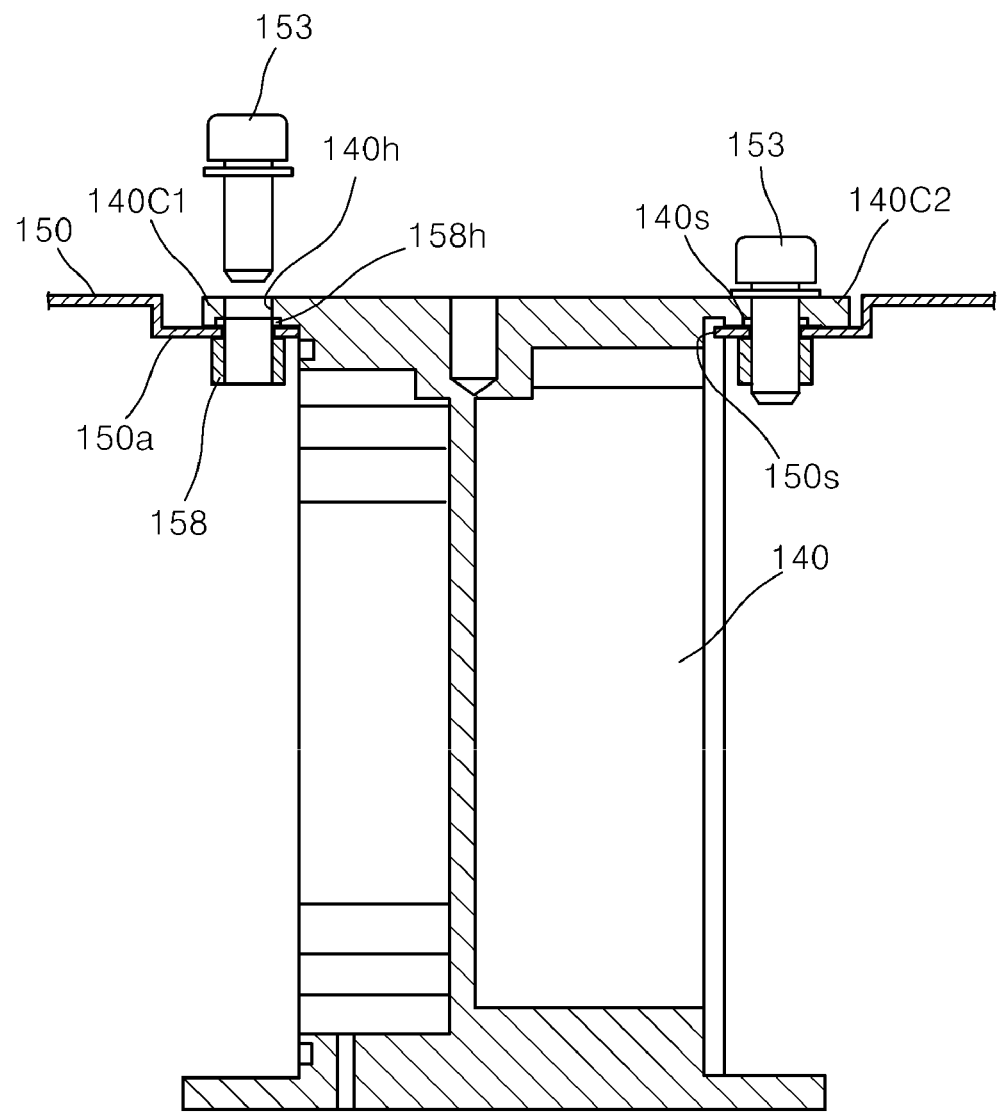
FIG. 18 is a cross-sectional view illustrating a modification of a coupling structure between the reflector and the RF module.
Figure 19:
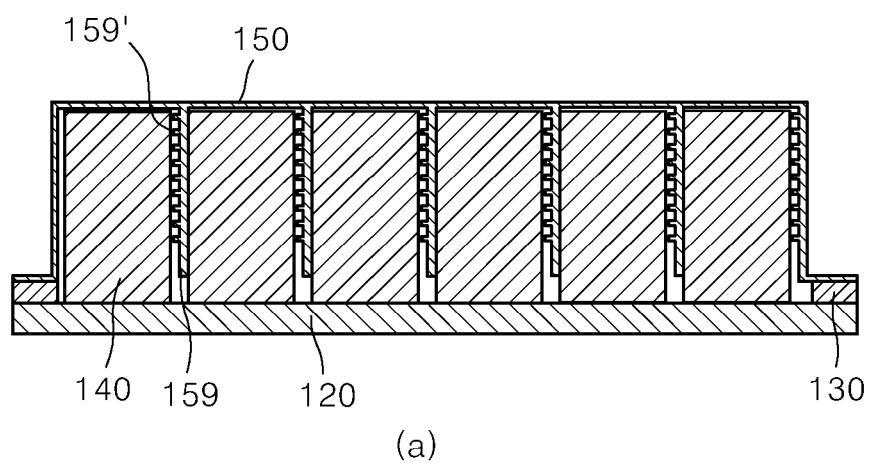
FIG. 19 is a cross-sectional view illustrating various modifications of a heat sink integrated reflector.
Figure 19:
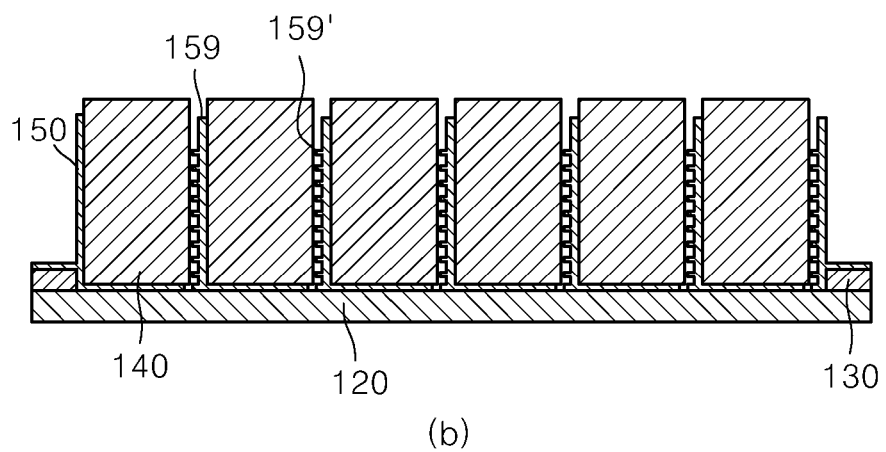
Figure 20:
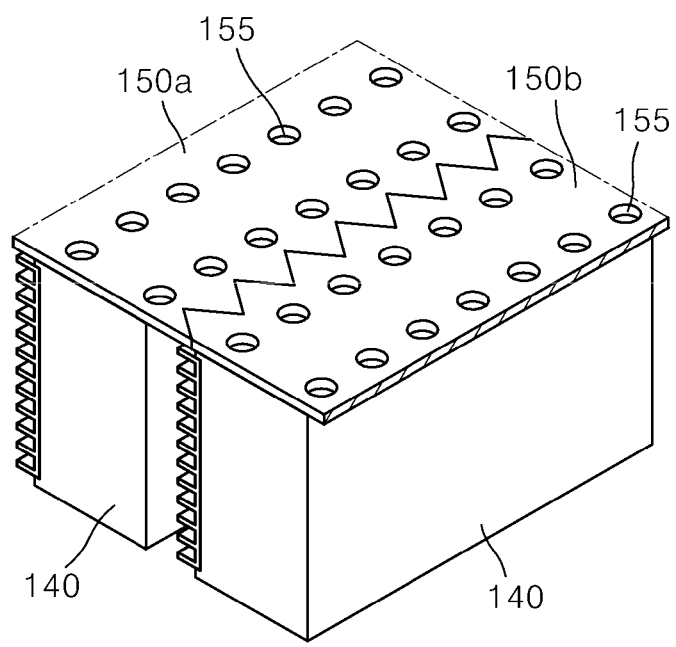
FIG. 20 is a perspective view illustrating a reflector separated in a unit of an RF module and its coupling structure.
Figure 21:
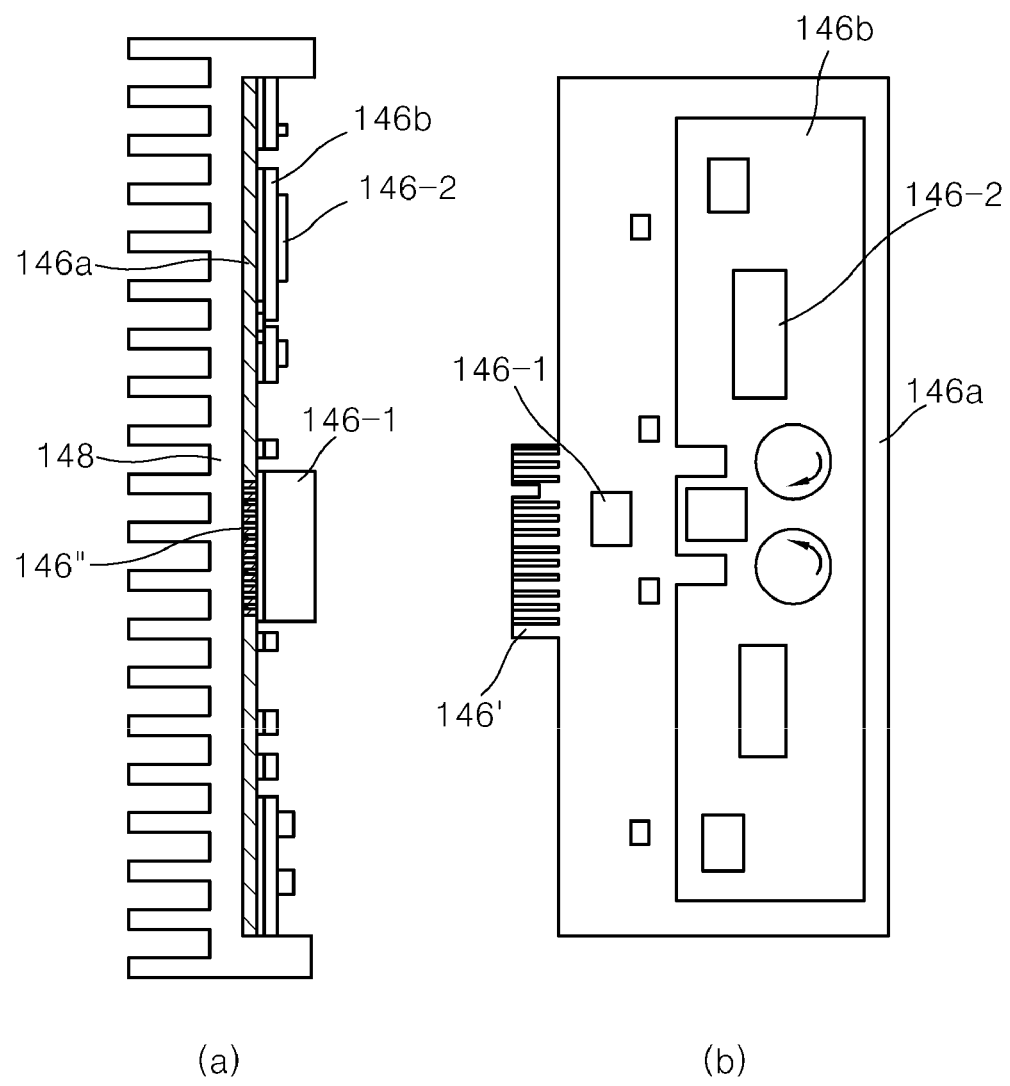
FIG. 21 is a cross-sectional view and a plan view illustrating a modified example of an amplifier substrate.
Figure 22:
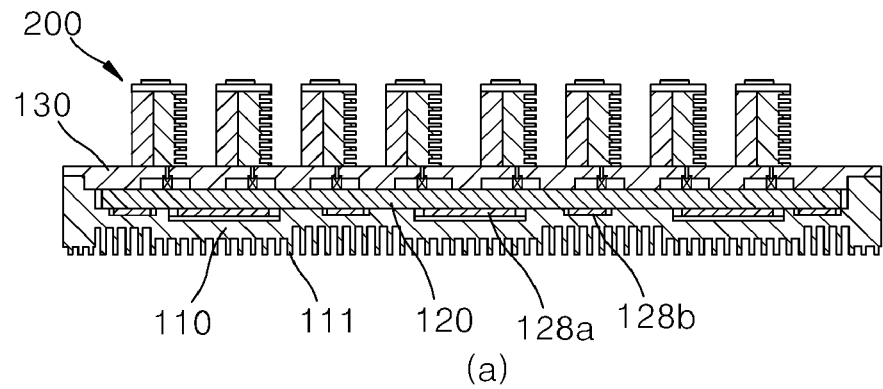
FIG. 22 is a cross-sectional view illustrating various installation states of the main board and the RF module assembly to the rear housing.
Figure 22:
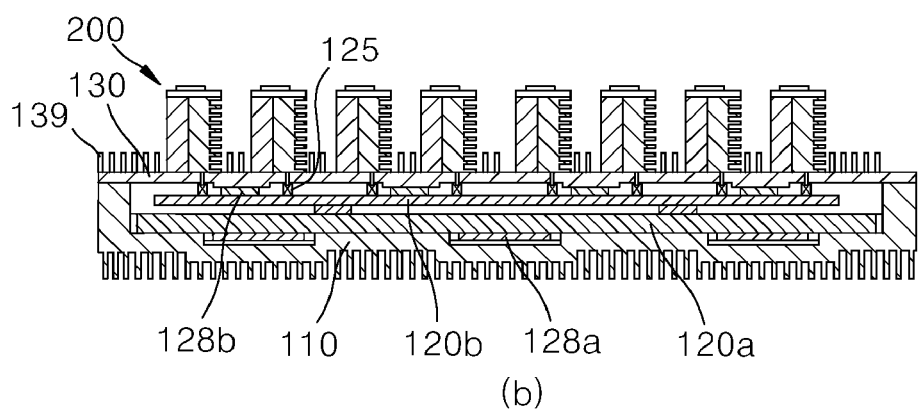
Figure 22:
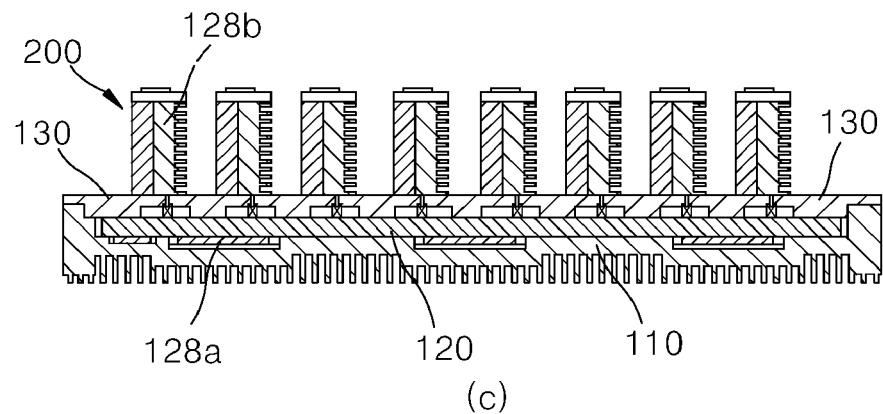
Figure 23:
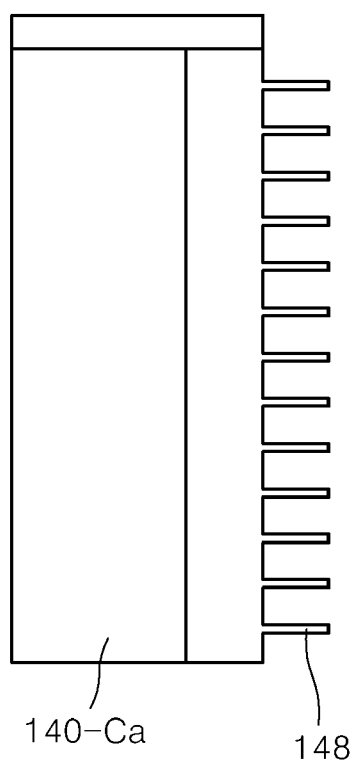
FIG. 23 is a perspective view illustrating various modifications of the RF module.
Figure 23:
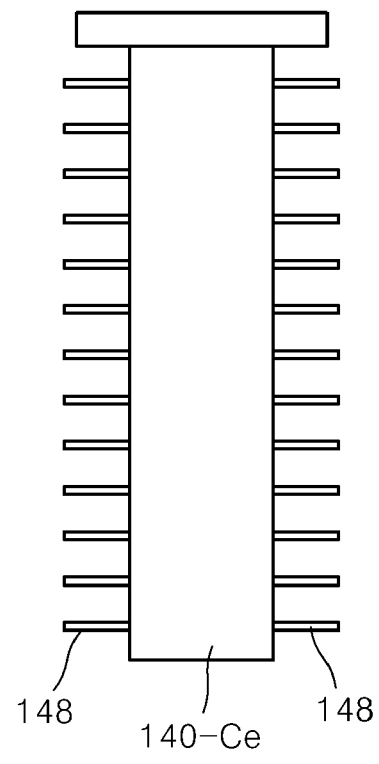
Figure 24:
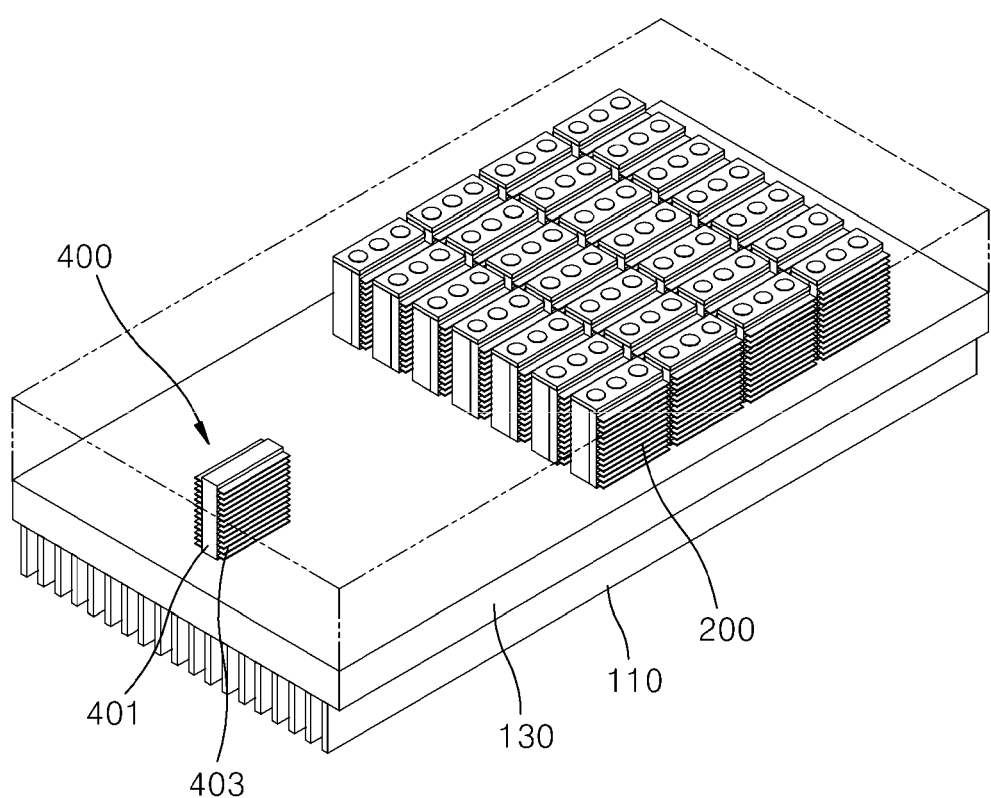
FIG. 24 is a perspective view illustrating a heat dissipation structure of a module type FPGA element.
Figure 25:
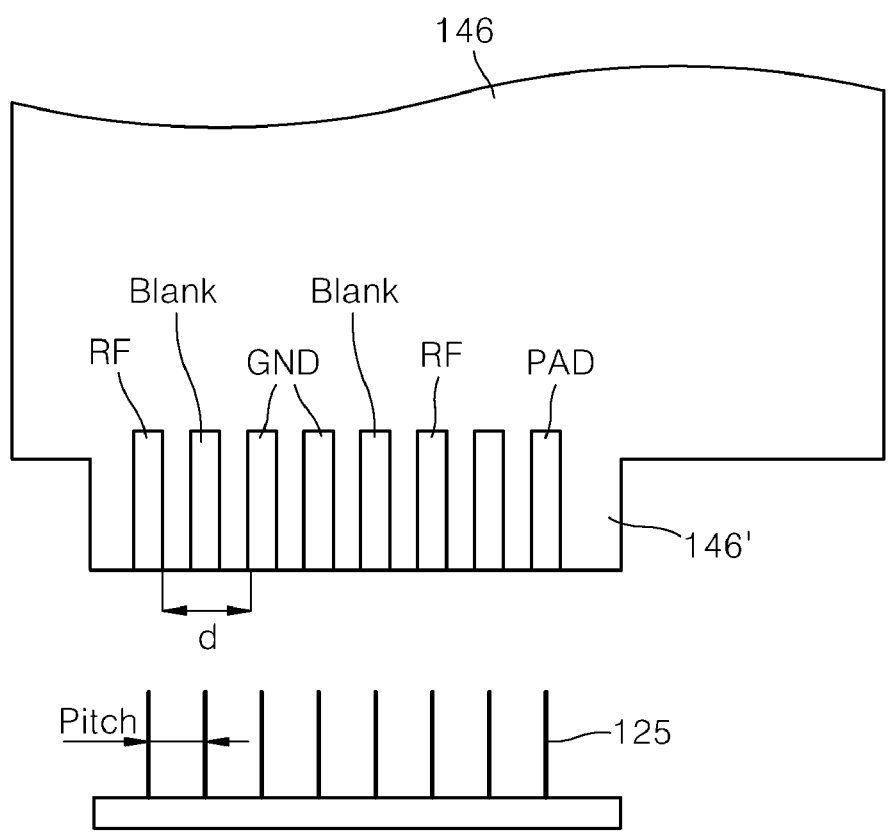
FIG. 25 is a conceptual diagram illustrating a detailed arrangement of a male socket part of the amplifier substrate and a female socket part of the main board.

FIG. 17 is a conceptual diagram illustrating a modification of an RF module according to an embodiment of the present invention, FIG. 18 is a cross-sectional view illustrating a modification of a coupling structure between the reflector and the RF module, FIG. 19 is a cross-sectional view illustrating various modifications of a heat sink integrated reflector, FIG. 20 is a perspective view illustrating a reflector separated in a unit of an RF module and its coupling structure, FIG. 21 is a cross-sectional view and a plan view illustrating a modified example of an amplifier substrate, FIG. 22 is a cross-sectional view illustrating various installation states of the main board and the RF module assembly to the rear housing, FIG. 23 is a perspective view illustrating various modifications of the RF module, FIG. 24 is a perspective view illustrating a heat dissipation structure of a module type FPGA element, and FIG. 25 is a conceptual diagram illustrating a detailed arrangement of a male socket part of the amplifier substrate and a female socket part of the main board.

Hereinafter, a usable variant of the antenna RF module 200 and the antenna device 100, which are each individual component of the antenna device 100 according to an embodiment of the present invention described above, will be described in more detail with reference to the accompanying drawings.

Referring to FIG. 17, the RF module 200 may include the RF filter 140, and the amplifier module 300 including the amplifier substrate 146 that is manufactured separately from the RF filter 140 and equipped with the male socket part 146' so as to be coupled to the female socket part 125 of the main board 120 by the socket pin. The amplifier substrate 146 of the amplifier module 300 may be disposed inside the amplifier substrate body 301 to be protected from the outside. However, although the method of coupling the amplifier substrate 146 to the main board 120 exemplifies the socket pin coupling, any configuration for slot or other electrical connection may be used.

In addition, the filter body 141 of the RF filter 140 and the amplifier substrate body 301 of the amplifier module 300 may be slidably bonded to each other in the front-rear direction or up-down direction.

Here, the filter body 141 of the RF filter 140 is physically fixed to the front housing 130, and may be electrically connected to the amplifier substrate body 301 of the amplifier module 300 through a direct coaxial connect (DCC) 140D.

The amplifier substrate body 301 may be first coupled to the main board 120 by the socket pin before fixing the RF filter 140 to the front housing 130, and then, as described above, may be module-coupled by a seating operation so that it is electrically connected by the coaxial connector 140D. However, the electrical connection does not necessarily have to be made through the coaxial connector 140D, and it goes without saying that any configuration capable of electrical signal connection can be employed.

When the RF filter 140 is defective or needs to be replaced for other reasons, the modification of the RF module 200 having such a configuration may separate and replace only the RF filter 140 from the amplifier substrate body 301 with one touch, and therefore, A/S becomes easy.

Meanwhile, in the antenna RF module 200 according to an embodiment of the present invention referred to in FIGS. 1 to 16, after the plurality of RF filters 140 is closely installed on the rear surface of the reflector 150, an assembly in which the plurality of radiation element modules 160 are closely installed on the front surface of the reflector 150 so that electrical signal connection is made with respect to each RF filter 140 has been described as an embodiment in which the assembling is completed by assembling the entire module in the front housing 130. However, in the case of the antenna RF module 200 according to an embodiment of the present invention described above, in order to replace only any one of the plurality of RF filters 140, there may be inconvenience in a process that necessarily requires a prior operation of separating the reflector 150 from the front housing 130.

As a modification to solve the above-mentioned process inconvenience, as illustrated in FIG. 18, the reflector 150 may have a structure in which the RF filter 140 is coupled via the pem nut 158 installed on the end portion side of the front edge of the RF filter 140.

More specifically, in the reflector 150, a plurality of installation holes 150s through which the RF filter 140 penetrates from the front to the rear may be formed at the location where the RF filter 140 is installed, and bending coupling parts 150a bent to the rear side may be formed at inner edge end portions of the plurality of installation holes 150s, respectively. Here, the RF filter 140 may be formed to have a width and length that may be inserted into the plurality of installation holes 50s except for a width and length of front edge end portions 140C1 and 140C2 and rear edge end portion (reference numerals not indicated), which will be described later.

In addition, in the reflector 150, a pem nut fixing hole 158h, which penetrates in the front-rear direction and fastens a pem nut 158 described later, may be formed in the portion where the bending coupling part 150a is formed. The pem nut fixing hole 150s may be formed at a position corresponding to a filter screw fastening hole 140h formed in the RF filter 140 to be described later.

As described above, the front edge end portions 140C1 and 140C2 of the RF filter 140 may be formed larger than the width and length of the plurality of installation holes 150s and disposed to be in face contact with the front surface of the bent bending coupling part 150a of the reflector 150, and the portion in face contact with each other may be formed with a filter screw fastening hole 140h penetrating in the front-rear direction to which the filter fixing screw 153 is fastened. In addition, a fixed end accommodating groove 140s accommodating the fixed end 158h of the pem nut 158, which will be described later, may be cut and formed in the rear surface portion of the front edge end portions 140C1 and 140C2 of the RF filter 140 in which the filter screw fastening hole 140h is formed.

In the pem nut fixing holes 150s formed in the bending coupling part 150a of the reflector 150, each pem nut 158 is coupled from the rear surface side, the fixing end 158h is fixed so as to be caught at the front end of the pem nut fixing hole 150s, and the filter fixing screw 153 may simultaneously penetrate through the filter screw fastening holes 140h of the front edge end portions 140C1 and 140C2 of the RF filter 140 and the bending coupling part 150a of the reflector 150 at the front side and may be fastened to the pem nut 158.

The modification of the RF module 200 having such a configuration provides an advantage of easy separation and replacement of the RF filter 140 requiring A/S among a plurality of RF filters 140 without separating the reflector 150 since only the desired RF filter 140 may be separated from the reflector 150 for replacement or repair when the filter fixing screw 153 is separated from the pem nut 158.

Meanwhile, the reflector 150 does not necessarily have to be provided with a metal material of SUS or STS. That is, although not illustrated in the drawing, the reflector 150 may be manufactured by injection molding with a plastic resin material and then may be manufactured in the form of being plated on the entire surface. When the reflector 150 is injection molded from a plastic resin material, it has an advantage of being able to design a plurality of heat dissipation holes 155 in various shapes.

In addition, the reflector 150 does not need to be made of SUS or STS material, and may be manufactured by the die casting method using an Al (aluminum) or Mg (magnesium) material.

In this case, as illustrated in FIG. 19A, separately from the filter heat sink panel 148 covering the amplifier substrate 146 of the RF module 200, a heat sink 159 may be integrally formed on the rear surface of the reflector 150 so as to protrude rearward. Here, each of the RF filters 140 may be individually accommodated and coupled in a space provided between the heat sinks 159.

In addition, as illustrated in FIG. 19B, separately from the filter heat sink panel 148 covering the amplifier substrate 146 of the RF module 200, the heat sink 159 may be integrally formed so as to protrude forward. Here, each of the RF filters 140 may be individually accommodated and coupled in a space provided between the heat sinks 159. In this case, the overall assembly of the RF module assembly to the front housing 130 has the advantage of being easy.

In addition, the heat sink 159 is not integrally formed with the reflector 150, but is integrally formed with the front housing 130 at the rear, thereby providing the installation spaces for each of the RF filters 140.

Meanwhile, the embodiments of the present invention described above, the reflector 150 will be described as being limited to the reflector 150 provided on a single panel shape and the plurality of RF filters 140 coupled to a single reflector 150, but as illustrated in FIG. 20, the reflector 150 may be provided with a plurality of reflectors 150a and 150b separated into two or more, but modified and implemented in a form coupled to each of the RF filters 140.

In this case, it is easy to employ a waterproof structure and implement the individual assembly of the front housing 130 or the main board 120 for each RF module 200 is possible, thereby providing an advantage of improving A/S performance.

However, it is preferable that each of the plurality of reflectors 150 is provided to come into contact with each other in a curved zigzag shape as illustrated in FIG. 20 to minimize the antenna pattern distortion.

In addition, when the distances of the radiation element modules 160 are arranged at a half-wavelength (½λ) distance, the plurality of heat dissipation holes 155 formed in the reflector 150 may be preferably formed to have a size in the range of ¹⁄₁₀ to ¹⁄₂₀ or less of the distance of the radiation element module 160, and designed in a shape including a polygonal shape forming a closed loop as well as a circular or square shape. However, the size and shape of the plurality of heat dissipation holes 155 are not intended to limit some range, and it goes without saying that the various sizes and shapes may be designed in a combined form.

In addition, although not illustrated in the drawing, the RF filter 140 of the RF module 200 is not manufactured in individual units, but may be manufactured in units of modules in the form of an array in a left-right direction or a vertical direction. For example, as in an embodiment of the present invention, when eight RF filters 140 are disposed in the left-right direction and four RF filters 140 are disposed in the up-down direction, the RF module 200 may be manufactured in units of 4 modules in which 8 RF filters 140 in the left-right direction are combined into one and manufactured in units of 8 modules in which 4 RF filters 140 in up-down direction are combined into one. In this way, the RF filter 140, the radiation element module 160, and the amplifier substrate 146 manufactured in the array form may be coupled to the front surface of the antenna housing 105 in units of modules.

Meanwhile, the amplifier substrate 146 may be separated into two PCBs and the plurality of analogue amplification elements may be separately mounted, as illustrated in FIG. 21A.

More specifically, as illustrated in FIG. 21, the amplifier substrate 146 may include the main amplifier substrate 146a which is disposed in close contact with an inner surface of the filter heat sink panel 148, has the above-described male socket part 146' provided on the end portion thereof, and an amplification element having a relatively large heating value among a plurality of analogue amplification elements mounted thereon, and the sub-amplifier substrate 146b which is stacked on the main amplifier substrate 146a, and has an amplification element having a relatively small heating value among the plurality of analogue amplification elements mounted thereon.

Here, when the amplification element having a relatively large heating value is mounted on the opposite surface to the surface in contact with the filter heat sink panel 148 in the main amplifier substrate 146a, the main amplifier substrate 146a may be formed with a plurality of metal paste via holes 146".

Since the plurality of metal paste via holes 146" are filled with a metal component having excellent thermal conductivity, the heat generated from the analogue amplification element (e.g., TR element, 146-1) having a relatively large heating value may be easily conducted toward the filter heat sink panel 148 through the plurality of metal paste via holes 146".

In this way, according to the modification of the amplifier substrate 146, the amplifier substrate 146 is provided as two separate PCB, and thus, the amplification element having a relatively large heating value and the amplification element 146a-2 having a relatively small heating value are separately mounted, thereby improving the thermal conductivity through the main amplifier substrate 146a and improving the complexity of signal connection structures of the main amplifier substrate 146a and the sub-amplifier substrate 146b.

The effect of improving the thermal conductivity and the complexity of the signal connection structure according to the modification of the amplifier substrate 146 as described above can be extended and applied to the main board 120 stacked in the internal space 110S of the rear housing 110.

More specifically, the main board 120 may also be provided by being separated into two PCBs like the amplifier substrate 146.

That is, referring to FIG. 22A, it has already been described that the main board 120 is provided as a single PCB in the internal space 110S of the rear housing 110, and the RF module 200 has a structure in which it is coupled by the socket pin through the male socket part 146' of the amplifier substrate 146' and electrically connected.

However, as shown in FIG. 22B, the main board 120 may include a first main board 120a which is disposed in close contact with the inner side surface of the rear housing 110 and mounted with a first heating element 128a having a relatively large heating value among a plurality of digital elements and a second main board 120b that is stacked on the front surface of the first main board 120a and mounted with a second heating element 128b having a relatively small heating value among the plurality of digital elements. Here, the first heating element 128a may be an FPGA element, and the second heating element 128b may be an RFIC element.

When the main board 120 is provided separately as the first main board 120a and the second main board 120b, the female socket part 125 for coupling the male socket part 146' formed on the amplifier substrate 146 of the RF module 200 by the socket pin is preferably formed on the front surface of the second main board 120b.

In addition, when the main board 120 is provided separately as the first main board 120a and the second main board 120b, a plurality of heat sink fins 139 may be integrally formed on the front surface of the front housing 130 to dissipate heat generated from the second heating element 128b mounted on the second main board 120b to the front.

Here, a digital signal may be connected between the first main board 120a and the second main board 120b. Meanwhile, as referred to in (c) of FIG. 22, the RFIC element 128b.

Meanwhile, as illustrated in FIG. 22C, the RFIC element 128b among the digital elements can be intensively installed in the RF module 200 or the amplifier substrate 146 of the RF module assembly. However, in this case, it is preferable to design the location so that optimal heat dissipation performance is realized in relation to the analog elements on the amplifier substrate 146 already provided inside the RF filter 140.

So far, the RF filter 140 of the RF module 200 has been described as being employed as a cavity filter as illustrated in FIG. 23A.

However, the RF module 200 is not necessarily limited to a cavity filter 140-Ca, and as illustrated in FIG. 23B, a dielectric ceramic filter 140-Ce can be employed.

In this case, the filter heat sink panel 148 may be formed on both surfaces of the filter body 141 provided as the dielectric ceramic filter 140-Ce, respectively, as illustrated in FIG. 23B.

As described above, since embodiments of the present invention have a structure that effectively dissipates heat generated from electric components with outside air corresponding to the front of the front housing 130, as illustrated in FIG. 24, among the plurality of digital elements mounted on the existing main board 120, the FPGA element 128a having a relatively large heating value may be modularized into the FPGA module 400, and move to the front surface of the front housing 130 corresponding to the external space like the RF module 200. Here, the FPGA module 400 includes an FPGA module body 401 in which the above-described FPGA element 128a is disposed, and an element heat sink panel 403 can be disposed on at least one of both end surfaces of the FPGA module body 401 to increase the heat dissipation performance. That is, by preparing the FPGA element 128a in the form of the FPGA module 400 and configuring the FPGA element to be coupled to the main board 120 by the socket pin, a better heat dissipation design is possible. However, since the FPGA module body 401 is directly exposed to the front outside air, it is preferable to apply a waterproof structure that prevents inflow of rainwater, etc., similarly to the RF module 200.

In addition, as illustrated in FIG. 25, a plurality of RF transmission lines and ground (GND) terminal lines may be provided in the male socket part 146' formed on the end portion of the amplifier substrate 146. Here, it is necessary to set a predetermined distance between the ground (GND) terminal line and the RF transmission line on the microstrip.

In the case of the female socket part 125 formed on the main board 120, since there is a predetermined pitch, the pitch distance may be different depending on the connector used.

Here, when arranging the RF transmission line, a distance (d) between the terminal pin related to the RF transmission line and the terminal pin related to the ground (GND) terminal line is preferably set so that pitch*n (number of pins)>d. To this end, it is preferable to perform blank processing between the terminal pin related to the RF transmission line and the terminal pin related to the ground (GND) terminal line.

In this way, the antenna device 100 may easily emit the internal system heat of the antenna device 100 in all directions including the front as well as the rear as much as the area exposed to the outside air due to the removal of the radome, and can realize the distributed heat dissipation in the front and rear directions of the antenna device 100 by exposing the radiation element module 160 to the outside air via the reflector 150, thereby greatly improving the heat dissipation performance compared to the related art.

In addition, since it is possible to reduce the protruding length forward by the volume occupied by the conventional radome but reduce the front and rear lengths of the plurality of rear heat dissipation fins 111 integrally formed on the rear surface of the rear housing 110 as much as the heat dissipation to the front, the front and rear thickness of the antenna device 100 may be designed to be slim as a whole, thereby creating an advantage of easy wall-mounted installation on the inner or outer wall of the building.

Hereinabove, various embodiments of an antenna RF module, an RF module assembly, and an antenna device including the same according to the present invention have been described in detail with reference to the accompanying drawings. However, it should be taken for granted that the embodiments of the present invention are not necessarily limited by the above-described embodiments, and various modifications and implementation within the equivalent range are possible by those skilled in the art to which the present invention belongs. Therefore, the true scope of the present invention will be determined by the claims described later.

INDUSTRIAL APPLICABILITY

The present invention provides an antenna RF module capable of greatly improving heat dissipation performance by removing the radome and disposing the antenna RF module outside the antenna housing so that the antenna RF module is exposed to the outside air to enable distributed heat dissipation in the front and rear of the antenna housing, and an antenna device including the same.

The invention claimed is:

1. An antenna RF module, comprising:
a radiation element module which is disposed on one surface of outer side surfaces of an RF filter;
an amplifier substrate which is disposed on another surface of the outer side surfaces of the RF filter and on which an analogue amplification element is mounted; and
a reflector which is disposed between the RF filter and the radiation element module to ground (GND) the radiation element module and mediate dissipation of heat generated by the RF filter to an outside,
wherein socket pins are coupled to a main board disposed at an antenna housing in a unit of a module,
wherein the amplifier substrate is provided inside an amplifier substrate body disposed parallel to the RF filter, and
the RF filter and the amplifier substrate body are electrically connected to each other through sliding coupling.

2. The antenna RF module of claim 1, wherein the unit of the module before coupling of a socket pin to the main board is defined as an assembly in which the RF filter is closely installed on a rear surface of the reflector and then the radiation element module is closely installed on a front surface of the reflector so that an electrical signal is connected to the RF filter.

3. The antenna RF module of claim 1, wherein the RF filter and the amplifier substrate are electrically connected by a coaxial connector when the RF filter is slidably coupled to the amplifier substrate body.

4. The antenna RF module of claim 1, wherein the RF filter and the reflector are coupled by a pem nut.

5. The antenna RF module of claim 4, wherein the reflector is provided with a plurality of installation holes through which the RF filter is installed by penetrating from front to rear and a bending coupling part bent rearward at an end portion of an inner edge of the plurality of installation holes, and
after the pem nut is fastened to a pem nut fixing hole penetrating in a front-rear direction of the bending coupling part, the RF filter is coupled by an operation in which a filter fixing screw penetrating through the RF filter penetrates through the pem nut from the front to the rear and is fastened.

6. The antenna RF module of claim 1, wherein the reflector is stacked on and coupled to a front surface of the RF filter, and
a plurality of heat sinks are integrally formed on a rear surface of the reflector so as to protrude rearward to accommodate the RF filter.

7. The antenna RF module of claim 1, wherein the reflector is stacked on and coupled to a rear surface of the RF filter, and
a plurality of heat sinks are integrally formed on a front surface of the reflector so as to protrude forward to accommodate the RF filter.

8. The antenna RF module of claim 1, wherein the reflector is provided in plurality to correspond to the number of the RF filters, and
is coupled to shield front surfaces of each of the RF filters, and portions in contact with each of the reflectors is provided to come into contact in a zigzag curved shape.

9. The antenna RF module of claim 1, wherein the reflector is provided with a plurality of heat dissipation holes, and
the plurality of heat dissipation holes have a size of $1/10$ to $1/20$ or less of a distance of between the radiation element modules when the distance between the radiation element modules is arranged at half-wavelength ($1/2\lambda$) distance.

10. The antenna RF module of claim 1, wherein a plurality of RF filters including the RF filter, a plurality of radiation element modules including the radiation element module, and a plurality of amplifier substrates including the amplifier substrate are manufactured in plurality in an array form in an up-down direction or a left-right direction and coupled to a front surface of the antenna housing in the unit of the module.

11. The antenna RF module of claim 1, wherein the RF filter includes a filter body having a predetermined space in which the amplifier substrate is disposed, and
the amplifier substrate includes a main amplifier substrate on which some of analogue amplification elements including the analogue amplification element are mounted and disposed in close contact with an inner surface of the filter body, and a sub-amplifier substrate on which the rest of the analogue amplification elements are mounted and disposed and which is stacked on the main amplifier substrate.

12. The antenna RF module of claim 11, wherein a metal paste via hole filled with a thermally conductive metal component is formed in a portion of the main amplifier substrate on which the analogue amplification element is mounted.

13. The antenna RF module of claim 1, wherein the analogue amplification element mounted on the amplifier substrate includes an RFIC element.

14. The antenna RF module of claim 1, wherein the RF filter includes a filter body employed as either a cavity filter or a dielectric ceramic filter, and
a filter heat sink panel made of a thermally conductive material is further provided on at least one of both surfaces of the filter body.

15. The antenna RF module of claim 1, wherein an FPGA module including an FPGA substrate having an FPGA element separated from the main board mounted therein is disposed on one side of the RF filter, and a socket pin is coupled to the main board.

16. The antenna RF module of claim 15, wherein the FPGA module includes an FPGA module body in which the FPGA substrate is disposed, and
an element heat sink panel is disposed on at least one of both end surfaces of the FPGA module body.

17. The antenna RF module of claim 1, wherein a male socket part is provided at an end portion of the amplifier substrate for coupling of a socket pin to the main board,
the male socket part is provided with a plurality of RF transmission lines and ground (GND) terminal lines, and
banking processing is performed between terminal pins related to the plurality of RF transmission lines and a terminal pin related to the ground (GND) terminal line.

18. An antenna RF module assembly, comprising:
a plurality of RF filters each having at least four outer side surfaces;
a plurality of radiation element modules which is disposed on one surface of outer side surfaces of each of the plurality of RF filters;

an amplifier substrate which is disposed on another surface of the outer side surfaces of each of the plurality of RF filters and on which an analogue amplification element is mounted; and a reflector which is disposed between the plurality of RF filters and the plurality of radiation element modules to ground (GND) the radiation element module and mediate dissipation of heat generated by the RF filter to an outside, wherein socket pins are coupled to a main board disposed at an antenna housing in a unit of a module.

19. An antenna device, comprising:

a main board on which at least one digital element is mounted on a front surface or a rear surface;

an antenna housing which has a shape of an enclosure whose front is opened so that the main board is installed therein; and an RF module assembly which is connected to the main board through an electrical signal line, wherein the RF module assembly includes: a plurality of RF filters each having at least four outer side surfaces;

a plurality of radiation element modules which is disposed on one surface of outer side surfaces of each of the plurality of RF filters;

an amplifier substrate which is disposed on another surface of the outer side surfaces of each of the plurality of RF filters and on which an analogue amplification element is mounted; and a reflector which is disposed between the plurality of RF filters and the plurality of radiation element modules to ground (GND) the radiation element module and mediate dissipation of heat generated by the RF filters to an outside, and socket pins are coupled to a main board disposed at an antenna housing in a unit of a module.

* * * * *